US010982346B2

(12) United States Patent
Berke et al.

(10) Patent No.: US 10,982,346 B2
(45) Date of Patent: *Apr. 20, 2021

(54) INTEGRATED ELASTOMERIC LIPSEAL AND CUP BOTTOM FOR REDUCING WAFER STICKING

(71) Applicant: Lam Research Corporation, Fremont, CA (US)

(72) Inventors: Aaron Berke, Portland, OR (US); Robert Rash, West Linn, OR (US); Steven T. Mayer, Aurora, OR (US); Santosh Kumar, Hillsboro, OR (US); Lee Peng Chua, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 280 days.

This patent is subject to a terminal disclaimer.

(21) Appl. No.: 16/053,546

(22) Filed: Aug. 2, 2018

(65) Prior Publication Data

US 2019/0040544 A1    Feb. 7, 2019

Related U.S. Application Data

(63) Continuation of application No. 14/936,328, filed on Nov. 9, 2015, now Pat. No. 10,053,793.

(Continued)

(51) Int. Cl.
*C25D 17/06* (2006.01)
*C25D 17/00* (2006.01)
(Continued)

(52) U.S. Cl.
CPC .............. *C25D 17/06* (2013.01); *C25D 5/02* (2013.01); *C25D 7/12* (2013.01); *C25D 17/001* (2013.01);
(Continued)

(58) Field of Classification Search
CPC ............ C25D 7/12–126; C25D 17/001; C25D 17/004; C25D 17/06–17/08
See application file for complete search history.

(56) References Cited

U.S. PATENT DOCUMENTS

| 4,466,864 A | 8/1984 | Bacon et al. |
| 4,654,235 A | 3/1987 | Effenberger et al. |
| (Continued) | | |

FOREIGN PATENT DOCUMENTS

| CN | 1433487 A | 7/2003 |
| CN | 1509348 A | 6/2004 |
| (Continued) | | |

OTHER PUBLICATIONS

U.S. Office Action, dated Nov. 4, 2011, issued in U.S. Appl. No. 13/154,224.

(Continued)

*Primary Examiner* — Alexander W Keeling
(74) *Attorney, Agent, or Firm* — Weaver Austin Villeneuve & Sampson LLP

(57) ABSTRACT

Disclosed are electroplating cups for holding, sealing, and providing electrical power to wafers during electroplating, where the electroplating cup can include a cup bottom, an elastomeric lipseal, and an electrical contact element. The cup bottom can include a radially inwardly protruding surface with a plurality of through-holes. The elastomeric lipseal can directly adhere to the radially inwardly protruding surface of the cup bottom, fill the plurality of through-holes, and encircle an inner edge of the cup bottom. In some implementations, this can mitigate the effects of wafer sticking. In some implementations, the cup bottom may be treated to promote adhesion between the elastomeric lipseal and the radially inwardly protruding surface of the cup bottom.

16 Claims, 14 Drawing Sheets

Related U.S. Application Data

(60) Provisional application No. 62/190,361, filed on Jul. 9, 2015.

(51) Int. Cl.
*H01L 21/67* (2006.01)
*C25D 7/12* (2006.01)
*C25D 5/02* (2006.01)
*H01L 21/687* (2006.01)

(52) U.S. Cl.
CPC ......... *C25D 17/004* (2013.01); *C25D 17/005* (2013.01); *H01L 21/67126* (2013.01); *H01L 21/68735* (2013.01)

(56) References Cited

U.S. PATENT DOCUMENTS

| | | |
|---|---|---|
| 5,227,041 A | 7/1993 | Brogden et al. |
| 6,071,388 A | 6/2000 | Uzoh |
| 6,080,291 A | 6/2000 | Woodruff et al. |
| 6,156,167 A | 12/2000 | Patton et al. |
| 6,303,010 B1 | 10/2001 | Woodruff et al. |
| 6,309,520 B1 | 10/2001 | Woodruff et al. |
| 6,550,484 B1 | 4/2003 | Gopinath et al. |
| 6,579,430 B2 | 6/2003 | Davis et al. |
| 6,589,401 B1 | 7/2003 | Patton et al. |
| 6,612,915 B1 | 9/2003 | Uzoh et al. |
| 6,613,214 B2 | 9/2003 | Dordi et al. |
| 6,755,946 B1 | 6/2004 | Patton et al. |
| 6,800,187 B1 | 10/2004 | Reid et al. |
| 6,869,510 B2 | 3/2005 | Woodruff et al. |
| 6,908,540 B2 | 6/2005 | Kholodenko |
| 7,033,465 B1 | 4/2006 | Patton et al. |
| 7,070,686 B2 | 7/2006 | Contolini et al. |
| 7,285,195 B2 | 10/2007 | Herchen et al. |
| 7,935,231 B2 | 5/2011 | Ghongadi et al. |
| 7,985,325 B2 | 7/2011 | Rash et al. |
| 8,172,992 B2 | 5/2012 | Prabhakar et al. |
| 8,377,268 B2 | 2/2013 | Rash et al. |
| 9,228,270 B2 | 1/2016 | Feng et al. |
| 9,988,734 B2 | 6/2018 | Feng et al. |
| 10,053,793 B2 * | 8/2018 | Berke .................... C25D 17/08 |
| 10,066,311 B2 | 9/2018 | Ostrowski et al. |
| 10,435,807 B2 | 10/2019 | Feng et al. |
| 2002/0000372 A1 | 1/2002 | Pedersen et al. |
| 2002/0053516 A1 | 5/2002 | Basol et al. |
| 2002/0108851 A1 | 8/2002 | Woodruff et al. |
| 2002/0144900 A1 | 10/2002 | Keigler |
| 2003/0010641 A1 | 1/2003 | Kholodenko |
| 2003/0085118 A1 | 5/2003 | Tench et al. |
| 2003/0085119 A1 | 5/2003 | Davis et al. |
| 2004/0149573 A1 * | 8/2004 | Herchen .............. C25D 17/001 204/297.01 |
| 2004/0171277 A1 | 9/2004 | Oh et al. |
| 2005/0014368 A1 | 1/2005 | Yoshioka et al. |
| 2005/0023149 A1 | 2/2005 | Nakada et al. |
| 2005/0284754 A1 | 12/2005 | Herchen et al. |
| 2006/0226000 A1 | 10/2006 | Hanson et al. |
| 2006/0237308 A1 | 10/2006 | Herchen |
| 2006/0246690 A1 | 11/2006 | Dordi et al. |
| 2009/0107835 A1 | 4/2009 | Ghongadi et al. |
| 2009/0107836 A1 | 4/2009 | Rash et al. |
| 2009/0117730 A1 | 5/2009 | Maitani et al. |
| 2010/0155254 A1 | 6/2010 | Prabhakar et al. |
| 2011/0233056 A1 | 9/2011 | Rash et al. |
| 2012/0043200 A1 | 2/2012 | Fujikata et al. |
| 2012/0137970 A1 | 6/2012 | Naruse et al. |
| 2012/0181170 A1 | 7/2012 | Prabhakar et al. |
| 2013/0042454 A1 | 2/2013 | Feng et al. |
| 2013/0062197 A1 | 3/2013 | He et al. |
| 2014/0230855 A1 | 8/2014 | Mayer et al. |
| 2015/0218726 A1 | 8/2015 | Feng et al. |
| 2016/0186355 A1 | 6/2016 | Feng et al. |
| 2016/0201212 A1 | 7/2016 | Ostrowski et al. |
| 2017/0009369 A1 | 1/2017 | Berke et al. |
| 2017/0073832 A1 | 3/2017 | Berke et al. |
| 2018/0347065 A1 | 12/2018 | Feng et al. |
| 2018/0363162 A1 | 12/2018 | Ostrowski et al. |
| 2019/0040544 A1 | 2/2019 | Berke et al. |

FOREIGN PATENT DOCUMENTS

| | | |
|---|---|---|
| CN | 1550033 A | 11/2004 |
| CN | 1623012 A | 6/2005 |
| CN | 1973361 A | 5/2007 |
| CN | 100370578 C | 2/2008 |
| CN | 101425471 A | 5/2009 |
| CN | 101798698 A | 8/2010 |
| CN | 102953104 A | 3/2013 |
| CN | 103031580 A | 4/2013 |
| CN | 103857834 A | 6/2014 |
| DE | 19859467 A1 | 7/2000 |
| JP | 2002-069698 | 3/2002 |
| JP | 2002-540011 | 11/2002 |
| JP | 2004-068093 A | 3/2004 |
| JP | 2004-83932 A | 3/2004 |
| JP | 2004-247738 A | 9/2004 |
| JP | 2004-270014 | 9/2004 |
| JP | 2008-95157 A | 4/2008 |
| JP | 2010-150659 | 7/2010 |
| JP | 2013-040404 A | 2/2013 |
| JP | 2013-064196 A | 4/2013 |
| KR | 10-2004-0019286 A | 3/2004 |
| KR | 10-2008-0007931 A | 1/2008 |
| KR | 10-2010-0067072 A | 6/2010 |
| TW | 544811 | 8/2003 |
| TW | 200409836 A | 6/2004 |
| TW | 200410296 A | 6/2004 |
| TW | 200511422 A | 3/2005 |
| TW | I244548 | 12/2005 |
| TW | 201028503 A | 8/2010 |
| TW | 201313968 A | 4/2013 |
| TW | 201331424 A | 8/2013 |
| TW | 201500595 A | 1/2015 |
| TW | I585246 B | 6/2017 |
| WO | WO 03/006718 A1 | 1/2003 |
| WO | WO 03/010368 A1 | 2/2003 |

OTHER PUBLICATIONS

U.S. Office Action, dated Mar. 16, 2012, issued in U.S. Appl. No. 13/154,224.
U.S. Final Office Action, dated Jul. 18, 2012, issued in U.S. Appl. No. 13/154,224.
U.S. Notice of Allowance, dated Oct. 4, 2012, issued in U.S. Appl. No. 13/154,224.
U.S. Office Action, dated Mar. 2, 2011, issued in U.S. Appl. No. 11/929,638.
U.S. Notice of Allowance, dated May 23, 2011, issued in U.S. Appl. No. 11/929,638.
U.S. Office Action, dated Mar. 6, 2017, issued in U.S. Appl. No. 14/685,526.
U.S. Notice of Allowance, dated Aug. 7, 2017, issued in U.S. Appl. No. 14/685,526.
U.S. Notice of Allowance, dated Feb. 6, 2018, issued in U.S. Appl. No. 14/685,526.
U.S. Office Action, dated Sep. 21, 2017, issued in U.S. Appl. No. 14/990,725.
Notice of Allowance dated May 1, 2018 issued in U.S. Appl. No. 14/990,724.
U.S. Notice of Allowance, dated Sep. 1, 2017, issued in U.S. Appl. No. 14/936,328.
U.S. Notice of Allowance, dated Apr. 12, 2018, issued in U.S. Appl. No. 14/936,328.
U.S. Office Action, dated Oct. 31, 2017, issued in U.S. Appl. No. 15/004,593.
U.S. Final Office Action dated May 11, 2018 issued in U.S. Appl. No. 15/004,593.
U.S. Office Action, dated Nov. 1, 2011, issued in U.S. Appl. No. 12/633,219.

(56) References Cited

OTHER PUBLICATIONS

U.S. Notice of Allowance, dated Jan. 12, 2012, issued in U.S. Appl. No. 12/633,219.
U.S. Notice of Allowance, dated Mar. 19, 2012, issued in U.S. Appl. No. 12/633,219.
Office Action dated Oct. 26, 2012 issued in U.S. Appl. No. 13/432,767.
Final Office Action dated Nov. 26, 2013 issued in U.S. Appl. No. 13/432,767.
Office Action dated Feb. 23, 2015 issued in U.S. Appl. No. 13/584,343.
Notice of Allowance dated Aug. 31, 2015 issued in U.S. Appl. No. 13/584,343.
Office Action dated Sep. 7, 2017 issued in U.S. Appl. No. 14/957,156.
Final Office Action dated Mar. 21, 2018 issued in U.S. Appl. No. 14/957,156.
Office Action dated Nov. 29, 2018 issued in U.S. Appl. No. 14/957,156.
Notice of Allowance dated Jun. 4, 2019 issued in U.S. Appl. No. 14/957,156.
Chinese First Office Action dated Jun. 20, 2017 issued in Application No. CN 201510837221.9.
Chinese Second Office Action dated Feb. 24, 2018 issued in Application No. CN 201510837221.9.
Chinese Third Office Action dated Aug. 28, 2018 issued in Application No. CN 201510837221.9.
Taiwanese First Office Action dated May 8, 2019 issued in Application No. TW 104139051.
Chinese First Office Action dated Jan. 29, 2018 issued in Application No. CN 201610539196.0.
Chinese Second Office Action dated Oct. 9, 2018, issued in Application No. CN 201610539196.0.
Third Office Action dated Jan. 18, 2019, issued in Application No. CN 201610539196.0.
Chinese First Office Action dated Jun. 21, 2018, issued in Application No. CN 201610818924.1.
Chinese Second Office Action dated Apr. 12, 2019 issued in Application No. CN 201610818924.1.
Chinese First Office Action dated May 2, 2013 issued in Application No. CN 200910211989.X.
Japanese Office Action, dated Oct. 2, 2012, issued in Application No. JP 2009-278998.
Korean Description of Notification of Provisional Rejection, dated May 10, 2012, issued in Application No. KR 2009-0122738.
Korean Notification of Decision to Grant, dated Sep. 4, 2012, issued in Application No. KR 2009-0122738.
U.S. Office Action, dated May 29, 2020, issued in U.S. Appl. No. 15/984,211.
U.S. Final Office Action, dated Sep. 10, 2020, issued in U.S. Appl. No. 15/984,211.
Office Action, dated Aug. 7, 2020 issued in U.S. Appl. No. 16/112,166.
Chinese First Office Action dated Nov. 21, 2019 issued in Application No. CN 201810986262.8.
Chinese Second Office Action dated Jun. 18, 2020 issued in Application No. CN 201810986262.8.
Japanese First Office Action [Notice of Rejection] dated Nov. 12, 2019 issued in Application No. JP 2015-225338.
Japanese Decision to Grant dated Jul. 7, 2020 issued in Application No. JP 2015-225338.
Singapore Notice of Eligibility and SER dated Mar. 24, 2020 issued in Application No. SG 10201509666S.
Taiwanese Notice of Allowance dated Aug. 27, 2019 issued in Application No. TW 104139051.
Taiwanese Notice of Allowance dated Apr. 15, 2020 issued in Application No. TW 108143043.
Taiwanese First Office Action dated Jan. 15, 2020, issued in Application No. TW 105121478.
Singapore Search Report and Written Opinion, dated Mar. 9, 2011, issued in Application No. SG 200908245.4.
Singapore Search and Examination Report, dated Oct. 27, 2011, issued in Application No. SG 200908245.4.
Taiwan International Search Report, dated Jun. 11, 2012, issued in Application No. TW 098142112.
Chinese Second Office Action Nov. 2, 2016 issued in Application No. CN 201210289735.1.
Chinese First Office Action dated Jan. 26, 2016 issued in Application No. CN 201210289735.1.
Chinese First Office Action dated Sep. 12, 2018 issued in Application No. CN 201710346886.9.
Chinese Second Office Action dated Jul. 2, 2019 issued in Application No. CN 201710346886.9.
Chinese Third Office Action dated Feb. 3, 2020 issued in Application No. CN 201710346886.9.
Japanese Second Office Action [Decision of Refusal] dated Mar. 14, 2017 issued in Application No. JP 2012-179853.
Japanese First Office Action [Notice of Reasons for Rejection] dated Jun. 28, 2016 issued in Application No. JP 2012-179853.
Korean First Office Action [Notice of Reason for Refusal] dated Jan. 14, 2019 issued in Application No. KR 10-2012-0089264.
Korean First Office Action dated Sep. 25, 2019 issued in Application No. KR 10-2019-0088045.
Singapore Examination Report dated May 20, 2015 issued in Application No. SG 201206129-7.
Singapore Search Report dated Oct. 6, 2014 issued in Application No. SG 201206129-7.
Taiwanese First Office Action dated May 12, 2016 issued in Application No. TW 101129602.
Taiwanese First Office Action dated Jul. 11, 2017 issued in Application No. TW 106105154.
Taiwanese First Office Action dated Feb. 18, 2019 issued in Application No. TW 107117041.
DuPont Teflon, Dupont, May 2015, 5pp [Downloaded on Oct. 11, 2017 at https://web.archive.org/web/20150301000000*https://plastics.ulprospector.com/generics/41/c/t/polyphenylene-sulfide-pps-properties-processing].
Guide to Whitford Industrial Coatings 2012, Whitford Worldwide, 3pp [Downloaded on Oct. 11, 2017 at https://web.archive.org/web/*/http://efpadm2.itum.com/files/files/rpn/7.pdf] (Year: 2012).
Wikipedia, the free encyclopedia, Definition of "Through hole" [Downloaded on Aug. 24, 2017 from https://en.wikipedia.org/wiki/Through_hole, 1 page.
Merriam-Webster Dictionary, Definition of "Integrate" [Downloaded on Aug. 28, 2017 at https://www.merriam-webster.com/dictionary/integrate], 12pp.
U.S. Final Office Action dated Jan. 6, 2021 issued in U.S. Appl. No. 16/112,166.
Chinese First Office Action dated Jan. 11, 2021, issued in Application No. CN 201910680929.6.
Singapore Notice of Eligibility and SER dated Feb. 4, 2021, issued in Application No. SG 10201605593W.

\* cited by examiner

INTEGRATED ELASTOMERIC LIPSEAL AND CUP BOTTOM FOR REDUCING WAFER STICKING

CROSS-REFERENCE TO RELATED APPLICATIONS

This application is a continuation of and claims priority to U.S. patent application Ser. No. 14/936,328, filed on Nov. 9, 2015, titled "INTEGRATED ELASTOMERIC LIPSEAL AND CUP BOTTOM FOR REDUCING WAFER STICKING," which claims the benefit of U.S. Provisional Patent Application No. 62/190,361, filed Jul. 9, 2015, and titled "CAPTURED CUP LIPSEAL FOR REDUCING WAFER STICKING," which is incorporated by reference herein in its entirety and for all purposes.

TECHNICAL FIELD

This disclosure relates to the formation of damascene interconnects for integrated circuits, and electroplating apparatuses which are used during integrated circuit fabrication.

BACKGROUND

Electroplating is a common technique used in integrated circuit (IC) fabrication to deposit one or more layers of conductive metal. In some fabrication processes it is used to deposit one or more levels of copper interconnects between various substrate features. An apparatus for electroplating typically includes an electroplating cell having a chamber for containing an electrolyte (sometimes called a plating bath) and a substrate holder designed to hold a semiconductor substrate during electroplating. In some designs, the wafer holder has a "clamshell" structure in which the substrate perimeter rests against a structure called a "cup."

During operation of the electroplating apparatus, a semiconductor substrate is submerged into the plating bath such that at least a plating surface of the substrate is exposed to electrolyte. One or more electrical contacts established with the substrate surface are employed to drive an electrical current through the electroplating cell and deposit metal onto the substrate surface from metal ions available in the electrolyte. Typically, the electrical contact elements are used to form an electrical connection between the substrate and a bus bar acting as a current source.

An issue arising in electroplating is the potentially corrosive properties of the electroplating solution. Therefore, in many electroplating apparatus a lipseal is used at the interface of the clamshell and substrate for the purpose of preventing leakage of electrolyte and its contact with elements of the electroplating apparatus other than the inside of the electroplating cell and the side of the substrate designated for electroplating.

SUMMARY

This disclosure pertains to a cup assembly for holding, sealing, and providing electrical power to a wafer during electroplating. The cup assembly includes a cup bottom sized to hold the wafer and comprising a main body portion and a radially inwardly protruding surface, where the radially inwardly protruding surface includes a plurality of through-holes. The cup assembly also includes an elastomeric lipseal disposed on the radially inwardly protruding surface, where the elastomeric lipseal, when pressed against by the wafer, seals against the wafer so as to define a peripheral region of the wafer from which plating solution is substantially excluded during electroplating, where portions of the elastomeric lipseal pass through the plurality of through-holes. The cup assembly further includes an electrical contact element disposed on or proximate the elastomeric lipseal, where the electrical contact element contacts the wafer in the peripheral region when the elastomeric seal seals against the wafer so that the electrical contact element may provide electrical power to the wafer during electroplating.

In some implementations, the portions of the elastomeric lipseal passing through the plurality of the through-holes also extend around an inner edge of the cup bottom. In some implementations, the elastomeric lipseal directly adheres to the radially inwardly protruding surface, and the portions of the elastomeric seal passing through the plurality of through-holes fill the plurality of through-holes and encircle the inner edge of the cup bottom. In some implementations, the cup assembly further includes an adhesive between the elastomeric lipseal and the radially inwardly protruding surface. In some implementations, the elastomeric lipseal is molded around a portion of the radially inwardly protruding surface of the cup bottom.

This disclosure also pertains to a method of preparing a cup assembly for holding, sealing, and providing electrical power to a wafer during electroplating. The method includes providing a cup bottom sized to hold the wafer and including a main body portion and a radially inwardly protruding surface, where the radially inwardly protruding surface comprises a plurality of through-holes. The method further includes affixing an elastomeric lipseal on the radially inwardly protruding surface, where the elastomeric lipseal, when pressed against by the wafer, seals against the wafer so as to define a peripheral region of the wafer from which plating solution is substantially excluded during electroplating, where portions of the elastomeric lipseal pass through the plurality of through-holes.

In some implementations, affixing the elastomeric lipseal includes providing a mold in the shape of the elastomeric lipseal around a portion of the radially inwardly protruding surface of the cup bottom, including the plurality of through-holes, delivering a lipseal precursor to the mold, and converting the lipseal precursor to the elastomeric lipseal. In some implementations, the portions of the elastomeric lipseal passing through the plurality of through-holes also extend around an inner edge of the cup bottom. In some implementations, the method further includes treating the radially inwardly protruding surface of the cup bottom, prior to affixing the elastomeric lipseal, with an agent that facilitates adhesion between the elastomeric lipseal and the radially inwardly protruding surface of the cup bottom. In some implementations, the method further includes applying an adhesive, prior to affixing the elastomeric lipseal, to the radially inwardly protruding surface of the cup bottom or the elastomeric lipseal to promote adhesion between the radially inwardly protruding surface of the cup bottom and the elastomeric lip seal.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with specific embodiments, it will be understood that these embodiments are not intended to be limiting.

In this disclosure, the terms "semiconductor wafer," "wafer," "substrate," "semiconductor substrate", "wafer substrate," "work piece" and "partially fabricated integrated circuit" are used interchangeably. One of ordinary skill in the art would understand that the term "partially fabricated integrated circuit" can refer to a silicon wafer during any of many stages of integrated circuit fabrication thereon. Further, the terms "electrolyte," "plating bath," "bath," and "plating solution" are used interchangeably. These terms may generally refer to catholyte (electrolyte present in a cathode chamber or cathode chamber recirculation loop), or to anolyte (electrolyte present in an anode chamber or anode chamber recirculation loop). The following detailed description assumes the disclosure is implemented on a wafer. However, the disclosure is not so limited. The wafer may be of various shapes, sizes, and materials. In addition to semiconductor wafers, other work pieces that may take advantage of this disclosure include various articles such as printed circuit boards and the like.

Lipseal and Cup Bottom Design

The information in this section and the following section presents one example of an apparatus including a substrate holder that may incorporate an integrated lipseal as described in more detail in later sections.

Figure 1A:
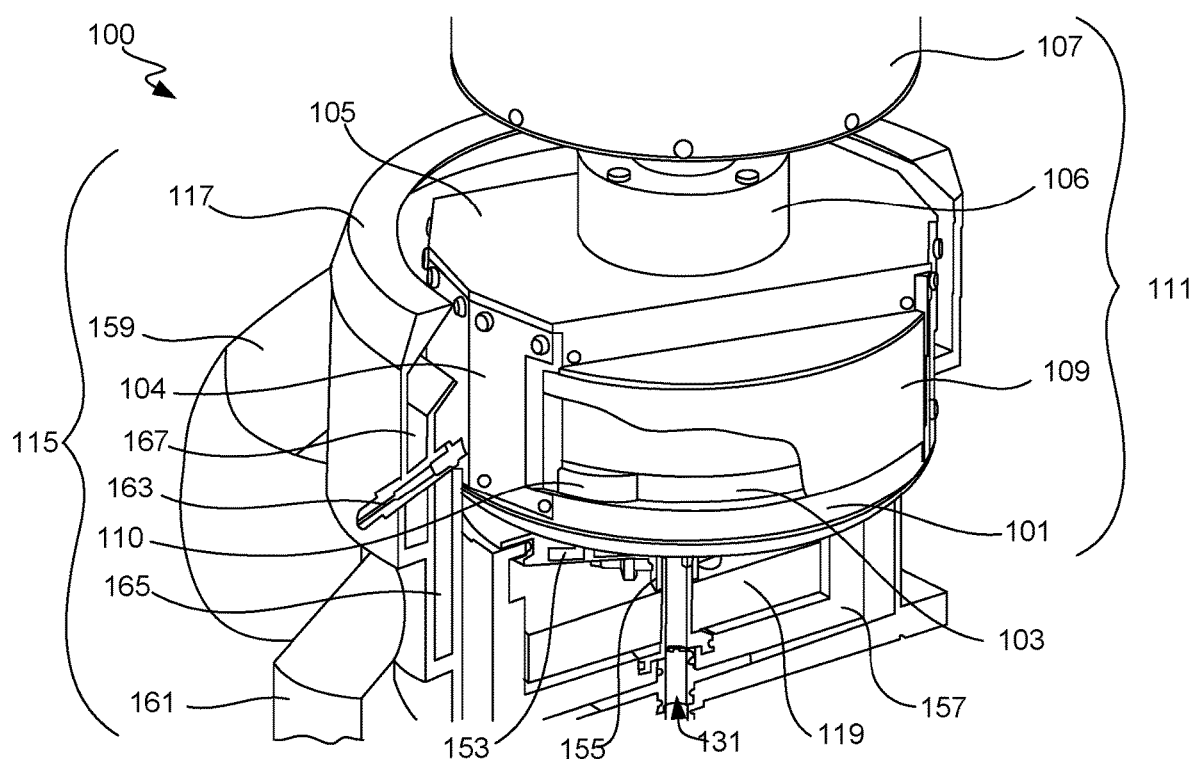
FIG. 1A is a perspective view of a wafer holding and positioning apparatus for electrochemically treating semiconductor wafers.

A substrate/wafer holding and positioning component of an electroplating apparatus is presented in FIG. 1A in order to provide some context for the various integrated lipseal and cup assemblies disclosed herein. Specifically, FIG. 1A presents a perspective view of a wafer holding and positioning apparatus 100 for electrochemically treating semiconductor wafers. The apparatus 100 includes wafer-engaging components, which are sometimes referred to as "clamshell components," or a "clamshell assembly," or just as a "clamshell." The clamshell assembly comprises a cup 101 and a cone 103. As will be shown in subsequent figures, the cup 101 holds a wafer and the cone 103 clamps the wafer securely in the cup. During an electroplating process, the semiconductor wafer is supported by the cup 101 and the cone 103. Other cup and cone designs beyond those specifically depicted here can be used. A common feature is that a cup that has an interior region in which the wafer resides and that the cone presses the wafer against the cup to hold it in place.

In the depicted embodiment, the clamshell assembly (which includes the cup 101 and the cone 103) is supported by struts 104, which are connected to a top plate 105. This assembly (101, 103, 104, and 105) is driven by a motor 107 via a spindle 106 connected to the top plate 105. The motor 107 is attached to a mounting bracket (not shown). The spindle 106 transmits torque (from the motor 107) to the clamshell assembly causing rotation of a wafer (not shown in this figure) held therein during plating. An air cylinder (not shown) within the spindle 106 also provides a vertical force for engaging the cup 101 with the cone 103. When the clamshell is disengaged (not shown), a robot with an end effector arm can insert a wafer in between the cup 101 and the cone 103. After a wafer is inserted, the cone 103 is engaged with the cup 101, which immobilizes the wafer within apparatus 100 leaving a working surface on one side of the wafer (but not the other) exposed for contact with the electrolyte solution.

In certain embodiments, the clamshell assembly includes a spray skirt 109 that protects the cone 103 from splashing electrolyte. In the depicted embodiment, the spray skirt 109 includes a vertical circumferential sleeve and a circular cap portion. A spacing member 110 maintains separation between the spray skirt 109 and the cone 103.

For the purposes of this discussion, the assembly including components 101-110 is collectively referred to as a "wafer holder" (or "substrate holder") 111. Note however, that the concept of a "wafer holder"/"substrate holder" extends generally to various combinations and sub-combinations of components that engage a wafer/substrate and allow its movement and positioning.

A tilting assembly (not shown) may be connected to the wafer holder to permit angled immersion (as opposed to flat horizontal immersion) of the wafer into a plating solution. A drive mechanism and arrangement of plates and pivot joints are used in some embodiments to move wafer the holder 111 along an arced path (not shown) and, as a result, tilt the proximal end of wafer holder 111 (which includes the cup and cone assembly) while it is immersed into the plating solution.

Further, the entire wafer holder 111 is lifted vertically either up or down to immerse the end of wafer holder into a plating solution via an actuator (not shown). Thus, a two-component positioning mechanism provides both vertical movement along a trajectory perpendicular to an electrolyte surface and a tilting movement allowing deviation from a horizontal orientation (i.e., parallel to the electrolyte surface) for the wafer (angled-wafer immersion capability).

Note that the wafer holder 111 is used with a plating cell 115 having a plating chamber 117 which houses an anode chamber 157 and a plating solution. The anode chamber 157 holds an anode 119 (e.g., a copper anode) and may include membranes or other separators designed to maintain different electrolyte chemistries in the anode compartment and a cathode compartment. In the depicted embodiment, a diffuser 153 is employed for directing electrolyte upward toward the rotating wafer in a uniform front. In certain embodiments, the flow diffuser is a high resistance virtual anode (HRVA) plate, which is made of a solid piece of insulating material (e.g. plastic), having a large number (e.g. 4,000-15,000) of one dimensional small holes (0.01 to 0.050 inches in diameter) and connected to the cathode chamber above the plate. The total cross-section area of the holes is less than about 5 percent of the total projected area, and, therefore, introduces substantial flow resistance in the plating cell helping to improve the plating uniformity of the system. Additional description of a high resistance virtual anode plate and a corresponding apparatus for electrochemically treating semiconductor wafers is provided in U.S. Pat. No. 8,308,931, issued on Nov. 13, 2012, which is hereby incorporated by reference herein in its entirety. The plating cell may also include a separate membrane for controlling and creating separate electrolyte flow patterns. In another embodiment, a membrane is employed to define an anode chamber, which contains electrolyte that is substantially free of suppressors, accelerators, or other organic plating additives.

The plating cell 115 may also include plumbing or plumbing contacts for circulating electrolyte through the plating cell—and against the work piece being plated. For example, the plating cell 115 includes an electrolyte inlet tube 131 that extends vertically into the center of anode chamber 157 through a hole in the center of anode 119. In other embodiments, the cell includes an electrolyte inlet manifold that introduces fluid into the cathode chamber below the diffuser/HRVA plate at the peripheral wall of the chamber (not shown). In some cases, the inlet tube 131 includes outlet nozzles on both sides (the anode side and the cathode side) of the membrane 153. This arrangement delivers electrolyte to both the anode chamber and the cathode chamber. In other embodiments, the anode and cathode chamber are separated by a flow resistant membrane 153, and each chamber has a separate flow cycle of separated electrolyte. As shown in the embodiment of FIG. 1A, an inlet nozzle 155 provides electrolyte to the anode-side of membrane 153.

In addition, plating cell 115 includes a rinse drain line 159 and a plating solution return line 161, each connected directly to the plating chamber 117. Also, a rinse nozzle 163 delivers deionized rinse water to clean the wafer and/or cup during normal operation. Plating solution normally fills much of the chamber 117. To mitigate splashing and generation of bubbles, the chamber 117 includes an inner weir 165 for plating solution return and an outer weir 167 for rinse water return. In the depicted embodiment, these weirs are circumferential vertical slots in the wall of the plating chamber 117.

Figure 1B:
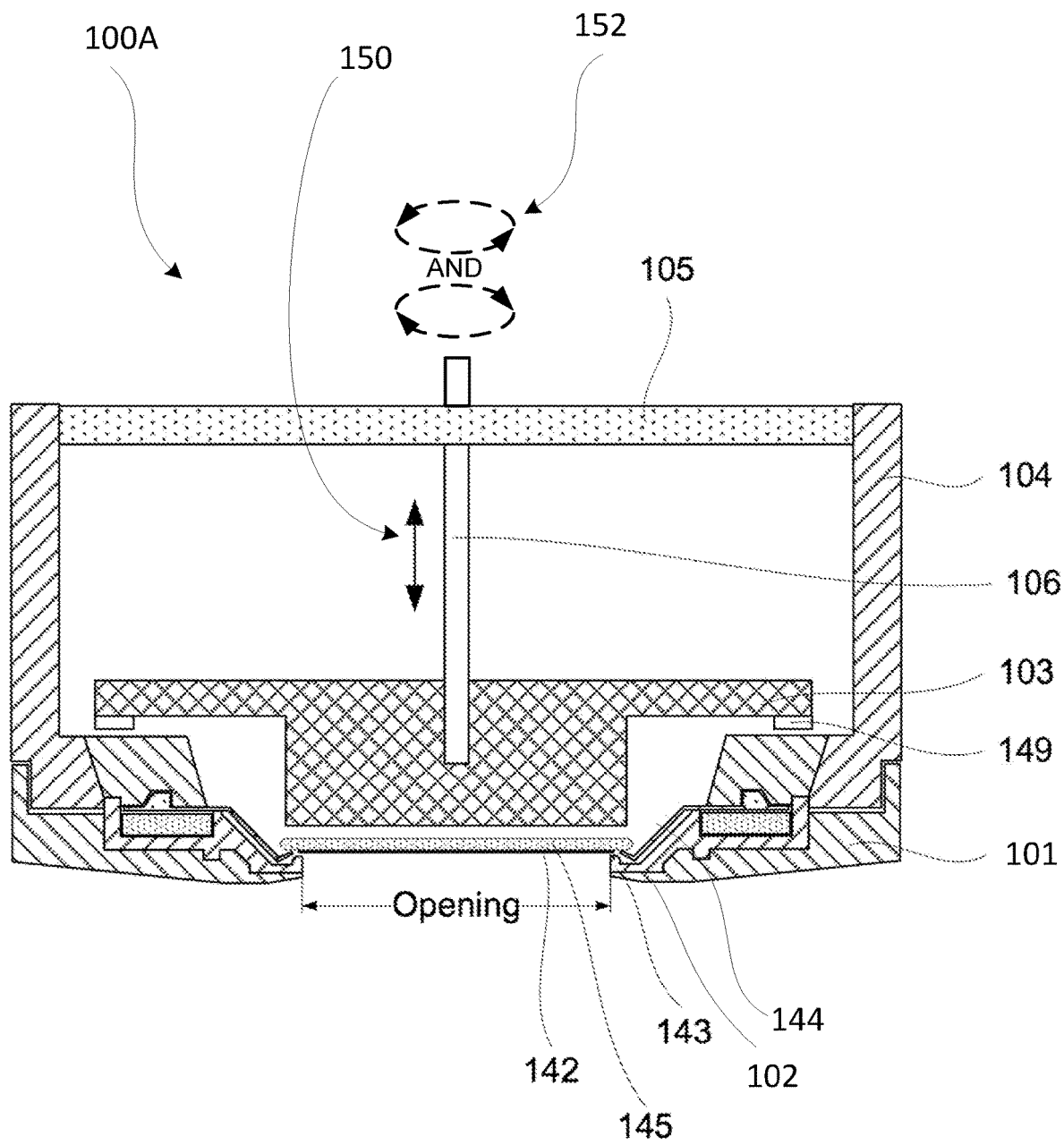
FIG. 1B presents a cross-sectional schematic of an electroplating substrate holder.

FIG. 1B provides a more detailed cross-sectional view of the substrate holding component 100A (the cup/cone assembly or clamshell assembly) of the electroplating apparatus, including a cross-sectional view of cup 101 and cone 103. Note that the cup/cone assembly 100A depicted in FIG. 1B is not intended to be proportionately accurate. Cup 101, having cup bottom 102, supports the lipseal 143, the contacts 144, bus bar, and other elements, and is itself supported by top plate 105 via struts 104. Generally, a substrate 145 rests on the lipseal 143, just above the contact 144, which is configured to support it. Cup 101 also includes an opening (as labeled in the figure) through which an electroplating bath solution may contact the substrate 145. Note that electroplating takes place on the front side 142 of substrate 145. Thus, the periphery of substrate 145 rests on a bottom inward protrusion of the cup 101 (e.g., "knife-shaped" edge) referred to as the cup bottom 102, or more specifically on lipseal 143 which is positioned on the radially inward edge of the cup bottom 102.

Cone 103 presses down on the back side of substrate 145 to engage it and hold it in place and to seal it against lipseal 143 during submersion of the substrate into the electroplating bath during electroplating. The vertical force from cone 103, which is transferred through substrate 145 compresses lipseal 143 to form the fluid tight seal. Lipseal 143 prevents electrolyte from contacting the backside of substrate 145 (where it could introduce contaminating metal atoms directly into silicon) and from reaching sensitive components of apparatus 100, such as contact fingers that establish electrical connections to edge portions of substrate 145. This electrical connection and associated electrical contacts 144, themselves sealed and protected by the lipseal from becoming wet, is used to supply current to conductive portions of substrate 145 that are exposed to the electrolyte. Overall, lipseal 143 separates unexposed edge portions of substrate 145 from exposed portions of substrate 145. Both portions include conductive surfaces that are in electronic communication with each other.

To load a substrate 145 into cup/cone assembly 100A, cone 103 is lifted from its depicted position via spindle 106 until there is a sufficient gap between the cup 101 and the cone 103 to allow insertion of substrate 145 into the cup/cone assembly 100A. The substrate 145 is then inserted, in some embodiments by a robot arm, and allowed to rest lightly on the lipseal and cup bottom 102 (or on a related component attached to the cup, such as a lipseal 143 as described below). In some embodiments, the cone 103 is lifted from its depicted position until it touches top plate 105. Subsequently, the cone 103 is then lowered to press and engage the substrate against the periphery of cup 101 (the cup bottom 102) or attached lipseal 143 as depicted in FIG. 1B. In some embodiments, the spindle 106 transmits both a vertical force for causing the cone 103 to engage the substrate 145, and also the torque for rotating the cup/cone assembly 100A as well as the substrate 145 being held by the cup/cone assembly. FIG. 1B indicates the directionality of the vertical force and rotational orientation of the torque by solid arrows 150 and dashed arrows 152, respectively. In some embodiments, electroplating of the substrate 145 typically occurs while the substrate 145 is rotating. In certain such embodiments, rotating the substrate 145 during electroplating aids in achieving uniform plating, and aids in removing metallic buildup removal as part of the process described in detail hereafter.

In some embodiments, there may also be an additional seal 149 located between the cup 101 and the cone 103, which engages the surfaces of the cup 101 and cone 103 to generally form a substantially fluid-tight seal when the cone 103 engages the substrate 145. The additional sealing provided by cup/cone seal 149 functions to further protect the backside of the substrate 145. Cup/cone seal 149 may be affixed to either the cup 101, or to the cone 103, engaging the alternative element when the cone 103 engages the substrate 145. Cup/cone seal 149 may be a single component seal or a multi-component seal. Similarly, lipseal 143 may be a single component seal or a multi-component seal. Furthermore, a variety of materials may be used to construct seals 143 and 149, as would be appreciated by one of ordinary skill in the art. For instance, in some embodiments, the lipseal is constructed of an elastomeric material, and in certain such embodiments, a perfluoropolymer.

As stated above, an electroplating clamshell typically includes a lipseal and one or more contact elements to provide sealing and electrical connection functions. A lipseal may be made from an elastomeric material. The lipseal forms a seal with the surface of the semiconductor substrate and excludes the electrolyte from a peripheral region of the substrate. No deposition occurs in this peripheral region and it is not used for forming IC devices, i.e., the peripheral region is not a part of the working surface. Sometimes, this region is also referred to as an edge exclusion area because the electrolyte is excluded from the area. The peripheral region is used for supporting and sealing the substrate during processing, as well as for making electrical connection with the contact elements. Since it is generally desirable to increase the working surface, the peripheral region needs to be as small as possible while maintaining the functions described above. In certain embodiments, the peripheral region is between about 0.5 millimeters and 3 millimeters from the edge of the substrate.

Figure 2:
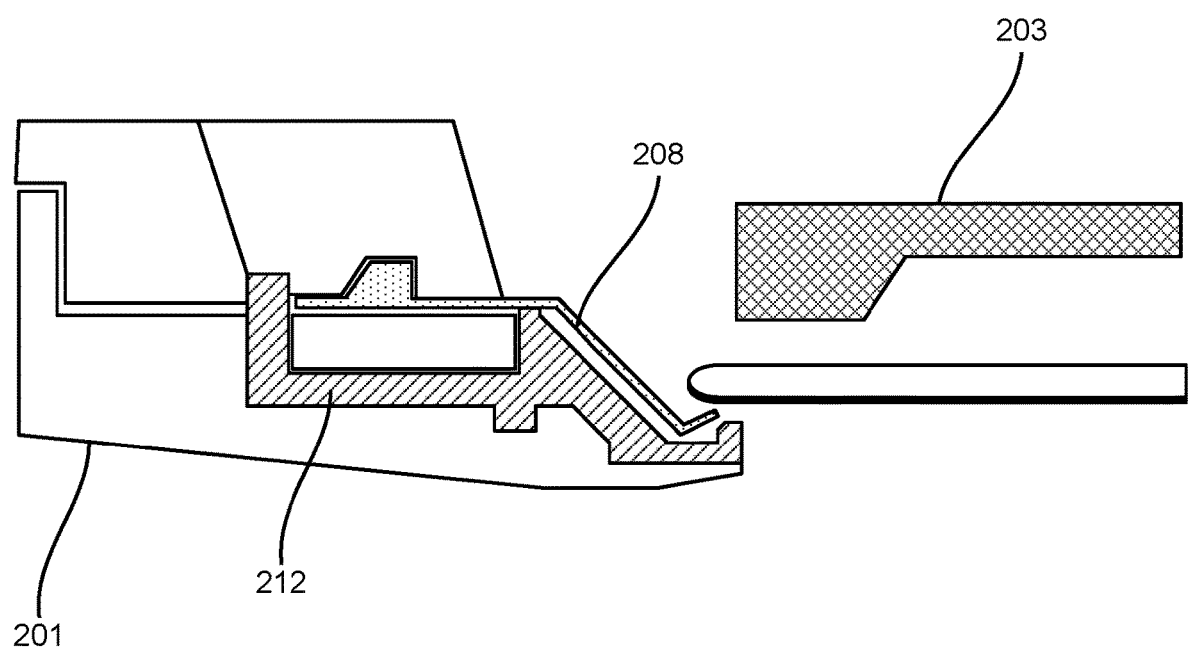
FIG. 2 is a cross-sectional schematic of a clamshell assembly having contact rings made with multiple flexible fingers.

During installation, the lipseal and contact elements are assembled together with other components of the clamshell. One having ordinary skilled in the art can appreciate the difficulty of this operation, particularly, when the peripheral region is small. An overall opening provided by this clamshell is comparable to the size of the substrate (e.g., an opening for accommodating 200 mm wafers, 300 mm wafers, 450 mm wafers, etc.). Furthermore, substrates have their own size tolerances (e.g., +/−0.2 millimeters for a typical 300 mm wafer according to the SEMI specification). A particularly difficult task is alignment of the elastomeric lipseal and contact elements, since both are made from relatively flexible materials. These two components need to have very precise relative location. When a sealing edge of the lipseal and contact elements are positioned too far away from each other, insufficient or no electrical connection may be formed between the contacts and substrate during operation of the clamshell. At the same time, when the sealing edge is positioned too close to the contacts, the contacts may interfere with the seal and cause leakage into the peripheral region. For example, conventional contact rings are often made with multiple flexible "fingers" that are pressed in a spring-like action onto the substrate to establish an electrical connection as shown in the clamshell assembly of FIG. 2 (note cup 201, cone 203, and lipseal 212).

Method of Sealing a Substrate in a Clamshell

Figure 3:
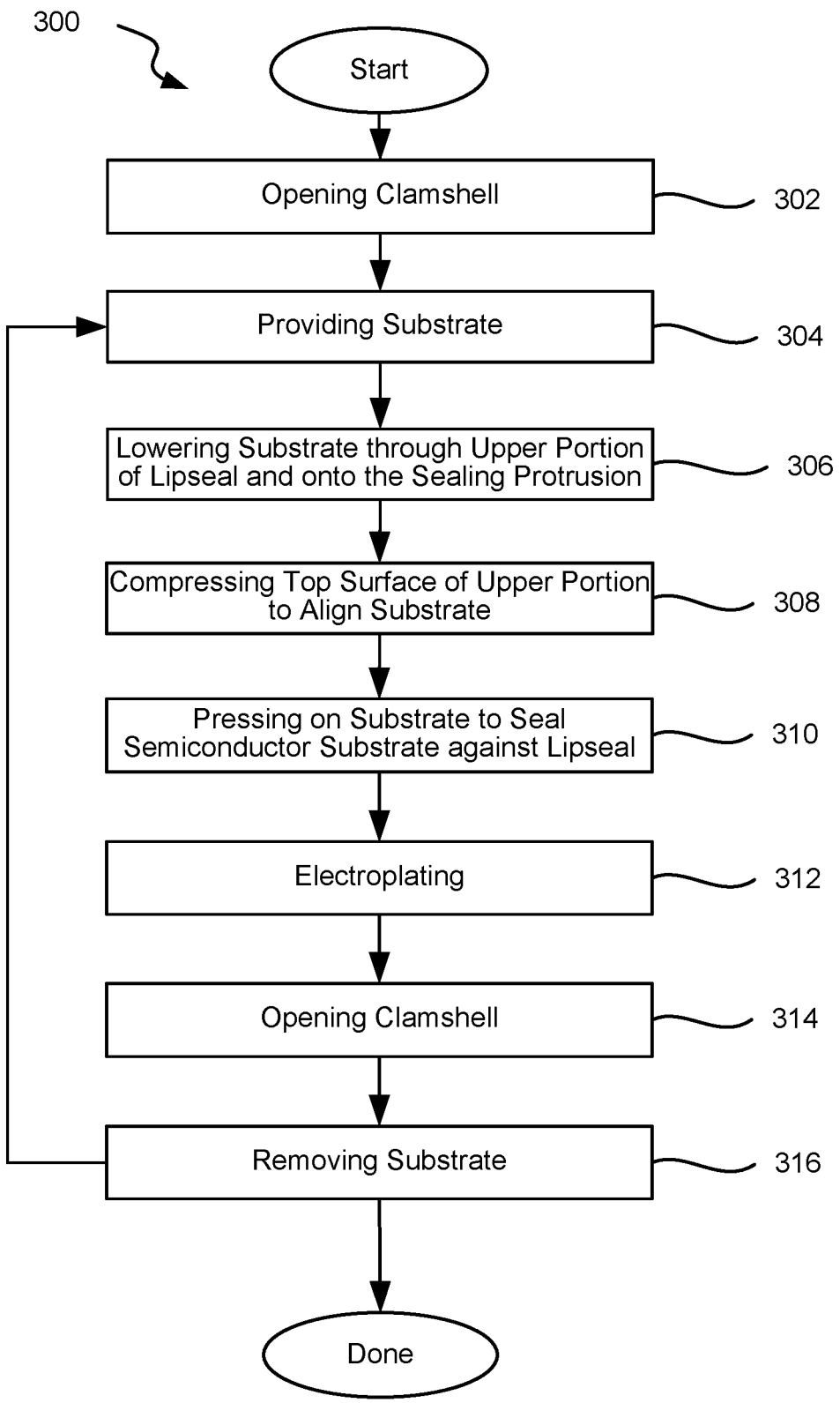
FIG. 3 is a flowchart illustrating a method of electroplating a semiconductor substrate.

Also disclosed herein are methods of sealing a semiconductor substrate in an electroplating clamshell having an elastomeric lipseal. The flowchart of FIG. 3 is illustrative of some of these methods. For instance, some methods involve opening the clamshell (block 302), providing a substrate to the electroplating clamshell (block 304), lowering the substrate through an upper portion of the lipseal and onto a sealing protrusion of the lipseal (block 306), and compressing a top surface of the upper portion of the lipseal to align the substrate (block 308). In some embodiments, compressing the top surface of the upper portion of the elastomeric lipseal during operation 308 causes an inner side surface of the upper portion to contact the semiconductor substrate and push on the substrate aligning it in the clamshell.

After aligning the semiconductor substrate during operation 308, in some embodiments, the apparatus presses the semiconductor substrate in operation 310 to form a seal between the sealing protrusion and the semiconductor substrate. In certain embodiments, compressing the top surface continues during pressing on the semiconductor substrate. For example, in certain such embodiments, compressing the top surface and pressing on the semiconductor substrate may be performed by two different surfaces of the cone of the clamshell. Thus, a first surface of the cone may press on the top surface to compress it, and a second surface of the cone may press on the substrate to form a seal with the elastomeric lipseal. In other embodiments, compressing the top surface and pressing on the semiconductor substrate are performed independently by two different components of the clamshell. These two pressing components of the clamshell are typically independently movable with respect to one another, thus allowing compression of the top surface to be halted once the substrate is pressed upon and sealed against the lipseal by the other pressing component. Furthermore, the compression level of the top surface may be adjusted based upon the diameter of the semiconductor substrate by independently altering the pressing force exerted upon it by its associated pressing component.

These operations may be part of a larger electroplating process, which is also depicted in the flowchart of FIG. 3 and briefly described below.

Initially, the lipseal and contact area of the clamshell may be clean and dry. The clamshell is opened (block 302) and the substrate is loaded into the clamshell. In certain embodiments, the contact tips sit slightly above the plane of the sealing lip and the substrate is supported, in this case, by the array of contact tips around the substrate periphery. The clamshell is then closed and sealed by moving the cone downward. During this closure operation, the electrical contacts and seals are established according to various embodiments described above. Further, the bottom corners of the contacts may be force down against the elastic lipseal base, which results in additional force between the tips and the front side of the wafer. The sealing lip may be slightly compressed to ensure the seal around the entire perimeter. In some embodiments, when the substrate is initially positioned into the cup only the sealing lip is contact with the front surface. In this example, the electrical contact between the tips and the front surface is established during compression of the sealing lip.

Once the seal and the electrical contact are established, the clamshell carrying the substrate is immersed into the plating bath and is plated in the bath while being held in the clamshell (block 312). A typical composition of a copper plating solution used in this operation includes copper ions at a concentration range of about 0.5-80 g/L, more specifically at about 5-60 g/L, and even more specifically at about 18-55 g/L and sulfuric acid at a concentration of about 0.1-400 g/L. Low-acid copper plating solutions typically contain about 5-10 g/L of sulfuric acid. Medium and high-acid solutions contain about 50-90 g/L and 150-180 g/L sulfuric acid, respectively. The concentration of chloride ions may be about 1-100 mg/L. A number of copper plating organic additives such as Enthone Viaform, Viaform NexT, Viaform Extreme (available from Enthone Corporation in West Haven, Conn.), or other accelerators, suppressors, and levelers known to those of skill in the art can be used. Examples of plating operations are described in more detail in U.S. patent application Ser. No. 11/564,222 filed on Nov. 28, 2006, which is hereby incorporated by reference in its entirety herein. Once the plating is completed and an appropriate amount of material has been deposited on the front surface of the substrate, the substrate is then removed from the plating bath. The substrate and clamshell are then spun to remove most of the residual electrolyte on the clamshell surfaces which has remained there due to surface tension and adhesive forces. The clamshell is then rinsed while continued to be spun to dilute and flush as much of the entrained electrolytic fluid as possible from clamshell and substrate surfaces. The substrate is then spun with rinsing liquid turned off for some time, usually at least about 2 seconds to remove some remaining rinsate. The process may proceed by opening the clamshell (block 314) and removing the processed substrate (block 316). Operational blocks 304 through 316 may be repeated multiple times for new wafer substrates, as indicated in FIG. 3.

Electroplating Cup Assemblies with Integrated Elastomeric Lipseal and Cup Bottom for Reducing Wafer Sticking The present disclosure relates with an integrated elastomeric lipseal and cup bottom of an electroplating cup assembly. As used herein, "integrated" can refer to two or more features attached or connected to one another such that neither of the features can be readily detached from one another. Nonetheless, two or more features that are integrated can be made of different materials and can serve independently different functions.

Typically, a cup-and-cone electroplating clamshell includes an elastomeric lipseal, which is manufactured separately from the other components of the electroplating clamshell. In other words, the elastomeric lipseal is manufactured as a distinct component for subsequent incorporation into the electroplating clamshell when assembled for operational use. This can stem from the fact that other clamshell components are generally not composed of elastomeric material. Rather, such clamshell components can be made of rigid materials including metals or hard plastics, so typically a separate molding or fabrication process would be used for them. However, because the lipseal is made of a flexible elastomeric material, and because the lipseal is thin and can be delicate in shape, the lipseal may separate from the cup bottom when a wafer is lifted away or otherwise removed from a cup bottom after electroplating.

Figure 4A:
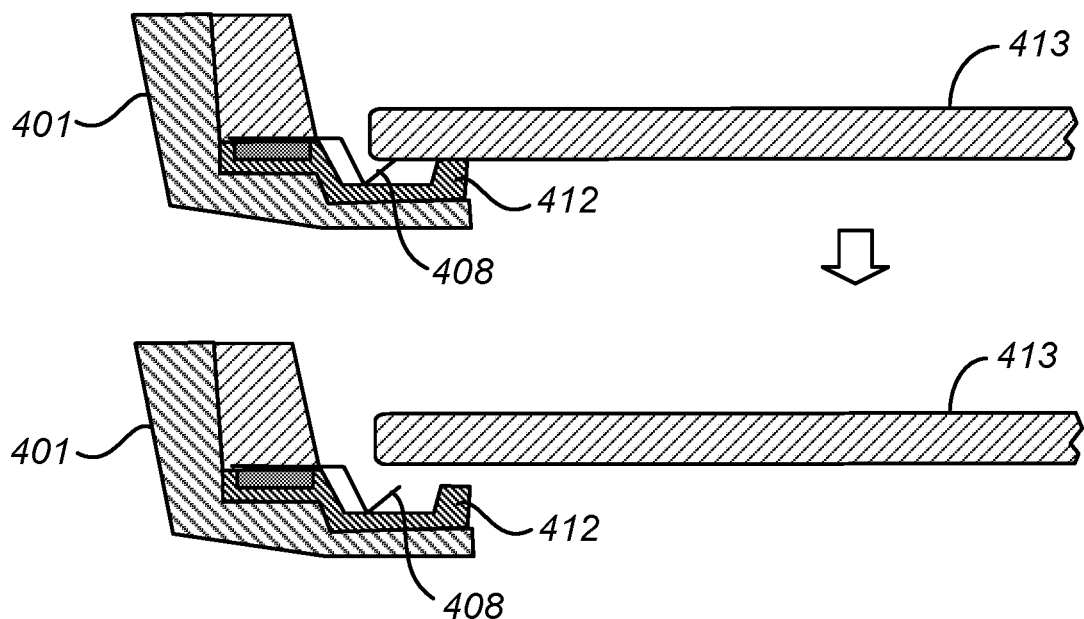
FIG. 4A is a cross-sectional schematic depicting removal of a wafer from an elastomeric lipseal on a cup bottom.
Figure 4B:
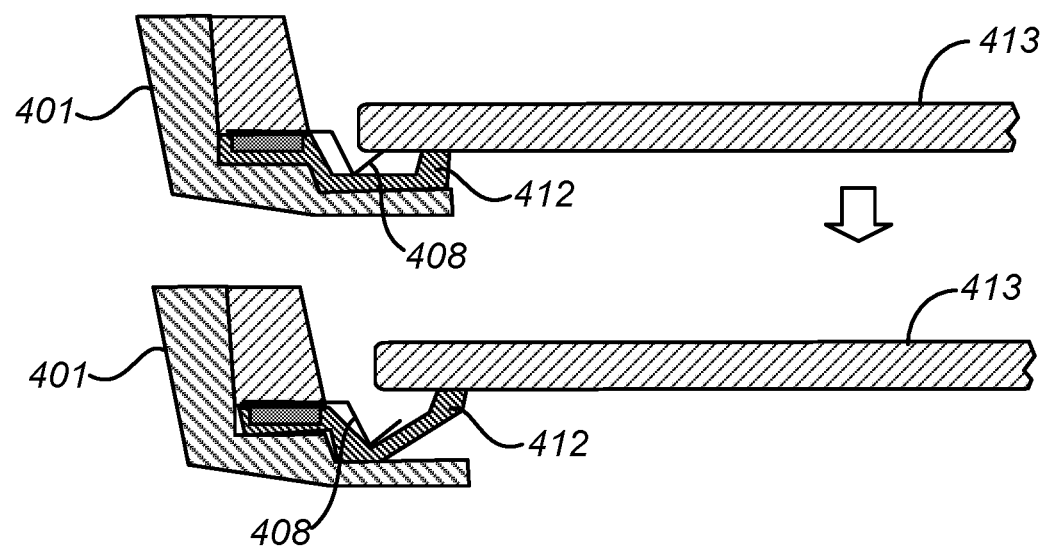
FIG. 4B is a cross-sectional schematic depicting a wafer sticking to an elastomeric lipseal during removal.

FIG. 4A is a cross-sectional schematic depicting removal of a wafer from an elastomeric lipseal on a cup bottom. FIG. 4B is a cross-sectional schematic depicting a wafer sticking to an elastomeric lipseal during removal. FIG. 4A depicts normal removal of an electroplated wafer from the elastomeric lipseal while FIG. 4B depicts removal in which the elastomeric lipseal sticks to the wafer and pulls away from the cup bottom. In wafer level packaging applications, a photoresist layer can be used on the wafer to mask areas where plating is not desirable. The photoresist can extend to within 2-4 mm of the wafer edge and can be present in the interface between the elastomeric lipseal and the wafer. Over time, photoresist residue can build up on the elastomeric lipseal, causing the wafer to stick to it. In addition, residual components from the electroplating bath may also form a residue on the elastomeric lipseal, which can further contribute to wafer sticking. Other sources of residue may also be present depending on the particular applications.

In FIGS. 4A and 4B, an elastomeric lipseal 412 is disposed on a cup bottom 401 of an electroplating cup assembly. An electrical contact element 408 is disposed on the elastomeric lipseal 412 and is configured to provide electrical power to a wafer 413 when in contact with the wafer 413. Prior to removal, the elastomeric lipseal 412 may support, align, and seal the wafer 413 from electrolyte in the electroplating cup assembly. As shown in FIG. 4A, when adhesion between the wafer 413 and the elastomeric lipseal 412 is minimal, the wafer 413 can be readily removed without damage to any components of the electroplating cup assembly. However, as shown in FIG. 4B, when adhesion between the wafer 413 and the elastomeric lipseal 412 is sufficiently strong, the wafer 413 sticks to the elastomeric lipseal 412. Tools for removing the wafer 413, such as a vacuum end effector of a wafer handling robot, may break contact and fail to remove the wafer 413 from the electroplating cup assembly. Moreover, the elastomeric lipseal 413 may pull away from the cup bottom 401, which can damage the electroplating cup assembly or at least necessitate replacement.

Figure 5A:
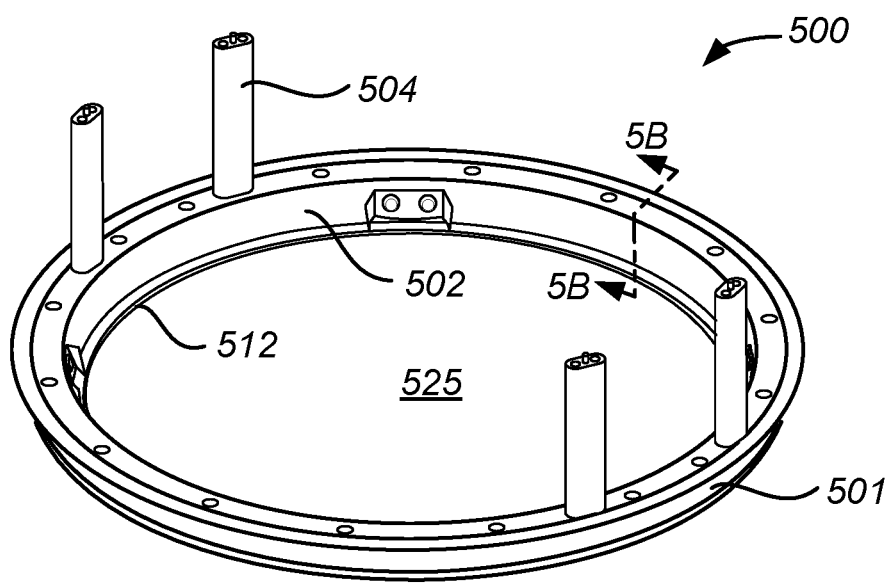
FIG. 5A shows a perspective view of an electroplating cup assembly.

FIG. 5A shows a perspective view of an electroplating cup assembly. As shown in FIG. 5A, an electroplating cup assembly 500 includes several features. The electroplating cup assembly 500 includes a cup bottom 501 that can be ring-shaped to define an opening 525 to allow exposure of a wafer to a plating solution. However, it will be understood that the cup bottom 501 can have other geometries other than ring-shaped. The electroplating cup assembly 500 can further include a bus ring 502 surrounding a main body portion of the cup bottom 501 and radially inwardly facing towards a center of the opening 525. In some implementations, the bus ring 502 may be a continuous thick ring of metal. A plurality of struts 504 may extend from a top surface of the bus ring 502 to support the electroplating cup assembly 500 in a clamshell. The electroplating cup assembly 500 can further include an elastomeric lipseal 512 positioned in the electroplating cup assembly 500 to prevent plating solution from reaching a peripheral region of the wafer. The elastomeric lipseal 512 can be disposed along a radially inwardly protruding surface of the cup bottom 501 and radially inwardly extending towards the center of the opening 525.

Figure 5B:
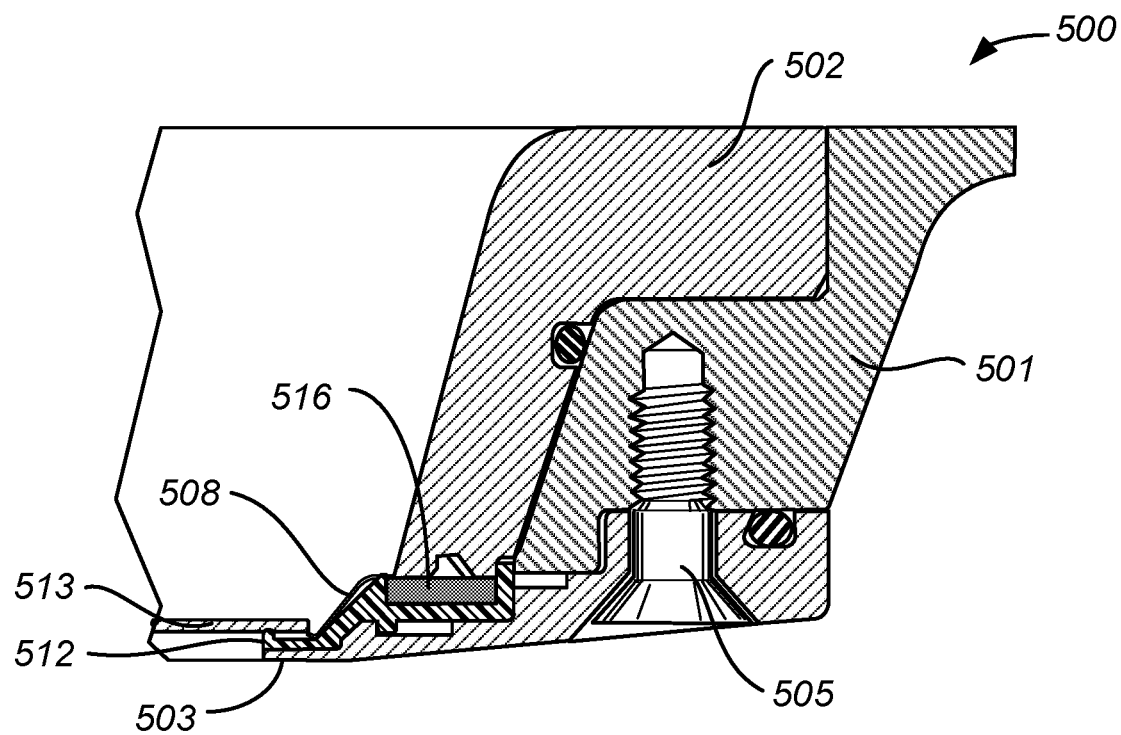
FIG. 5B shows a cross-sectional view of the electroplating cup assembly along line 5B-5B in FIG. 5A.

FIG. 5B shows a cross-sectional view of the electroplating cup assembly along line 5B-5B in FIG. 5A. As shown in FIG. 5B, the cup bottom 501 can include a main body portion that the bus ring 502 is disposed on. The cup bottom 501 also includes a portion that radially inwardly protrudes towards the center of the opening 525 defined by the cup bottom 501. A radially inwardly protruding portion can refer to a structure protruding towards a center of a shape, including a shape defined by the cup bottom 501. The radially inwardly protruding portion of the cup bottom 501 and the main body portion of the cup bottom 501 can be connected by an attaching mechanism 505, such as a screw. The radially inwardly protruding portion of the cup bottom 501 provides an exposed surface in the opening upon which additional features of the electroplating cup assembly 500 may be built. This surface may be referred to as a radially inwardly protruding surface 503. The elastomeric lipseal 512 can be disposed on the radially inwardly protruding surface 503 of the cup bottom 501. The elastomeric lipseal 512 can support a wafer 513 provided in the electroplating cup assembly 500. The elastomeric lipseal 512 can also align and seal the wafer 513 in the electroplating cup assembly 500 to substantially exclude plating solution from reaching a peripheral region of the wafer 513. The electroplating cup assembly 500 can further include one or more electrical contact elements 508 configured to provide an electrical connection between an external power supply and the wafer 513. The one or more electrical contact elements 508 can be disposed on or proximate the elastomeric lipseal 512. The one or more electrical contact elements 508 may contact the wafer 513 in the peripheral region when the elastomeric lipseal 512 seals against the wafer 513. The one or more electrical contact elements 508 may be configured to provide electrical power to the wafer 513 during electroplating. In some implementations, the one or more electrical contact elements 508 may be electrically connected to a current distribution bus 516 for supplying current to the one or more electrical contact elements 508, which may be electrically connected to the bus ring 502. In some implementations, the one or more electrical contact elements 508 may be integrated with the elastomeric lipseal 512, as described in U.S. application Ser. No. 14/685,526, filed Apr. 13, 2015, and titled "LIPSEALS AND CONTACT ELEMENTS FOR SEMICONDUCTOR ELECTROPLATING APPARATUSES," and U.S. patent application Ser. No. 13/584,343, filed Aug. 13, 2012, and titled "LIPSEALS AND CONTACT ELEMENTS FOR SEMICONDUCTOR ELECTROPLATING APPARATUSES," each of which is incorporated herein by reference in its entirety and for all purposes.

As described earlier, the elastomeric lipseal 512 on the radially inwardly protruding surface 503 of the cup bottom 501 in FIG. 5B may be vulnerable to wafer sticking. The present disclosure can mitigate the effects of wafer sticking by manufacturing the elastomeric lipseal with the cup bottom of a cup assembly. That way, the elastomeric lipseal and the cup bottom can be integrated in a manner that makes it difficult for them to separate from one another during electroplating operations, and more particularly during removal of the wafer from the cup assembly. The elastomeric lipseal and the cup bottom can be strongly attached and/or adhered to each other so that they resist separation. As described below, the elastomeric lipseal can be disposed, formed, placed, or positioned directly on the cup bottom and directly into one or more through-holes of the cup bottom. Such an arrangement can improve adhesion of the elastomeric lipseal to the cup bottom.

Figure 6A:
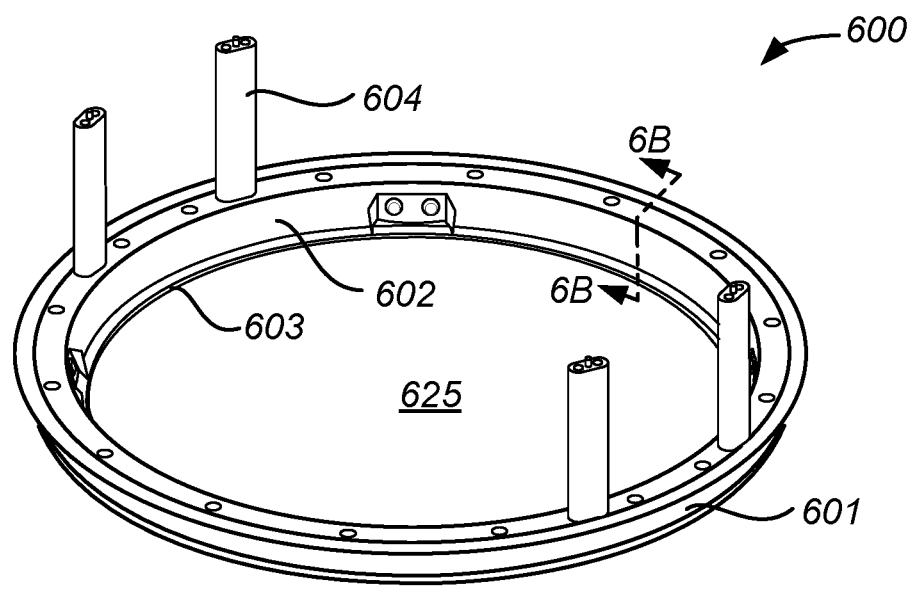
FIG. 6A shows a perspective view of an electroplating cup assembly with an interlocked elastomeric lipseal and cup bottom.

FIG. 6A shows a perspective view of an electroplating cup assembly with an interlocked elastomeric lipseal and cup bottom. The electroplating cup 600 includes a cup bottom 601 that can be ring-shaped to define an opening 625 to allow exposure of a wafer to a plating solution. However, it will be understood that the cup bottom 601 can have geometries other than ring-shaped. The electroplating cup assembly 600 can further include a bus ring 602 surrounding a main body portion of the cup bottom 601 and radially inwardly facing towards a center of the opening 625. In some implementations, the bus ring 602 may be a continuous thick ring of metal. A plurality of struts 604 may extend from a top surface of the bus ring 602 to support the electroplating cup assembly 600 in a clamshell. The electroplating cup assembly 600 can further include an elastomeric lipseal 612 positioned in the electroplating cup assembly 600 to prevent plating solution from reaching a peripheral region of the wafer. The elastomeric lipseal 612 can be disposed along a radially inwardly protruding surface of the cup bottom 601 and radially inwardly extending towards the center of the opening 625.

Figure 6B:
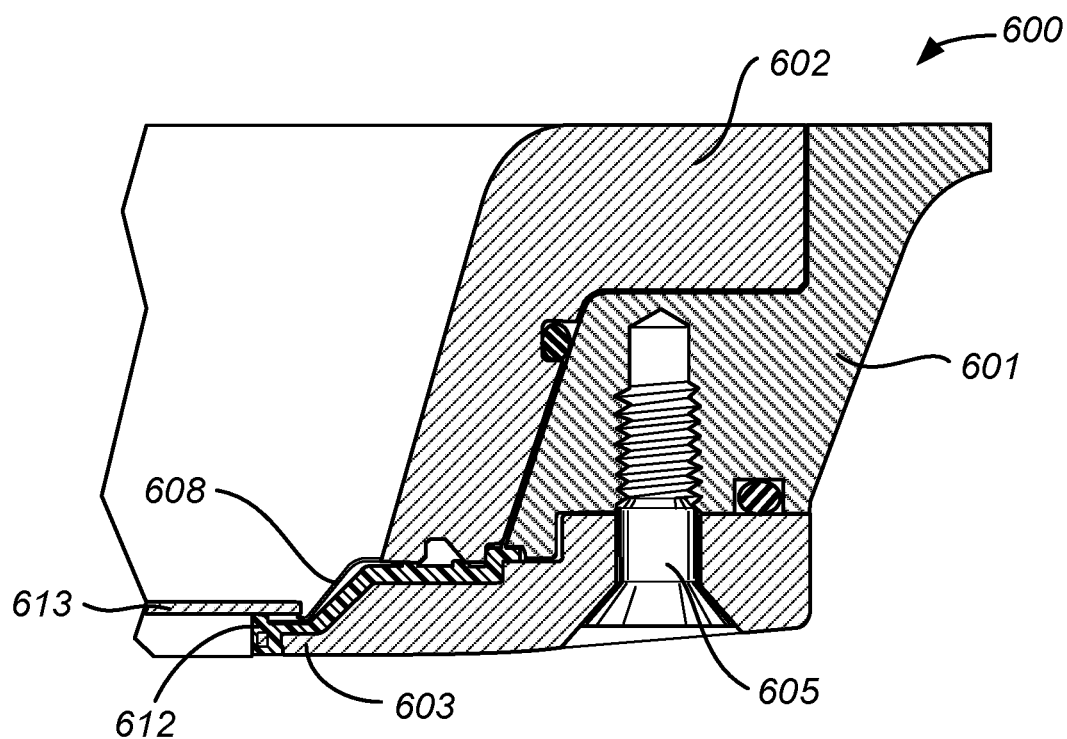
FIG. 6B shows a cross-sectional view of the electroplating cup assembly with the interlocked elastomeric lipseal and cup bottom along line 6B-6B in FIG. 6A.

FIG. 6B shows a cross-sectional view of the electroplating cup assembly with the interlocked elastomeric lipseal and cup bottom along line 6B-6B in FIG. 6A. As shown in FIG. 6B, the cup bottom 601 can include a main body portion upon which the bus ring 602 is disposed on. The cup bottom 601 can also include a portion that radially inwardly protrudes towards the center of the opening defined by the cup bottom 601. The radially inwardly protruding portion of the cup bottom 601 and the main body portion can be connected by an attaching mechanism 605, such as a screw. The radially inwardly protruding portion of the cup bottom 601 provides an exposed surface in the opening upon which additional features of the electroplating cup assembly 600 may be built. This surface may be referred to as a radially inwardly protruding surface 603. The elastomeric lipseal 612 can be disposed on the radially inwardly protruding surface 603 of the cup bottom 601.

In FIG. 6B, the radially inwardly protruding surface 603 can be shaped and structured to improve adhesion of the elastomeric lipseal 612 to the cup bottom 601. In some implementations, the radially inwardly protruding surface 603 can include a mechanical structure for preventing the elastomeric lipseal 612 from detaching from the surface of the cup bottom 601 to which it is attached. For example, the mechanical structure can include one or more holes (typically a series of holes) in a radially inwardly protruding surface 603 of the cup bottom 601. Each of the holes can hold a "pillar" of elastomeric lipseal material so that the elastomeric lipseal 612 can encircle the inner lip of the cup bottom 601 where the holes exist, as shown in FIG. 6B. In some implementations, the radially inwardly protruding surface 603 can be outfitted with structural features other than holes. Such structural features can include pegs, divots, serrations, hooks, trenches, and the like. The elastomeric lipseal 612 can be disposed on and even surrounding the structural features so that the elastomeric lipseal 612 can be mechanically interlocked or integrated with the cup bottom 601.

In some implementations, the cup bottom 601 may be made from a relatively rigid material, or at least a more rigid material than the elastomeric lipseal 612. For example, the cup bottom can be made of poly(p-phenylene sulfide) (PPS). Adhesion to PPS and similar cup bottom materials can be difficult, so retention may be achieved with one or more of the following: a chemical pretreatment of the cup bottom 601, in situ molding of the elastomeric lipseal 612 in the cup bottom 601, and mechanical interlocking of the elastomeric lipseal 612 with the cup bottom 601. This can improve adhesion of the elastomeric lipseal 612 to the cup bottom 601, which can prevent the elastomeric lipseal 612 from separating and reduce the effects of wafer sticking.

The elastomeric lipseal 612 can support a wafer 613 in the electroplating cup assembly 600. The elastomeric lipseal 612 can also align and seal the wafer 613 in the electroplating cup assembly 600 to substantially exclude the plating solution from reaching a peripheral region of the wafer 613. The radially inwardly protruding surface 603 of the cup bottom 601 (and the associated elastomeric lipseal 612) can be sized and shaped to engage with a perimeter of the wafer 613. In various implementations, the wafer 613 is a semiconductor wafer such as a 200-mm, 300-mm, or 450-mm wafer, so the inner diameter of the elastomeric lipseal 612, and typically the supporting cup bottom 601, is very slightly smaller than 200-mm, 300-mm, or 450-mm, such as about 1-5 mm smaller.

The electroplating cup assembly 600 can further include one or more electrical contact elements 608 configured to provide an electrical connection between an external power supply and the wafer 613. The one or more electrical contact elements 608 can be disposed on or proximate the elastomeric lipseal 612. The one or more electrical contact elements 608 may contact the wafer 613 in the peripheral region when the elastomeric lipseal 612 seals against the wafer 613. The one or more electrical contact elements 608 may be configured to provide electrical power to the wafer 613 during electroplating. In some implementations, the one or more electrical contact elements 608 may be electrically connected to a current distribution bus for supplying current to the one or more electrical contact elements 608, which may be electrically connected to the bus ring 602. In some implementations, the one or more electrical contact elements 608 may be integrated with the elastomeric lipseal 612.

Figure 7A:
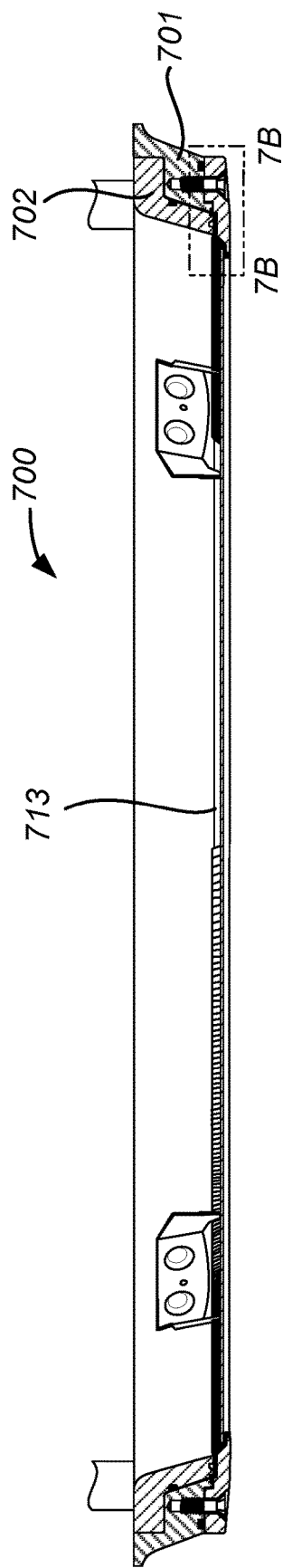
FIG. 7A shows a cross-sectional side view of an electroplating cup assembly with an interlocked elastomeric lipseal and cup bottom.
Figure 7B:
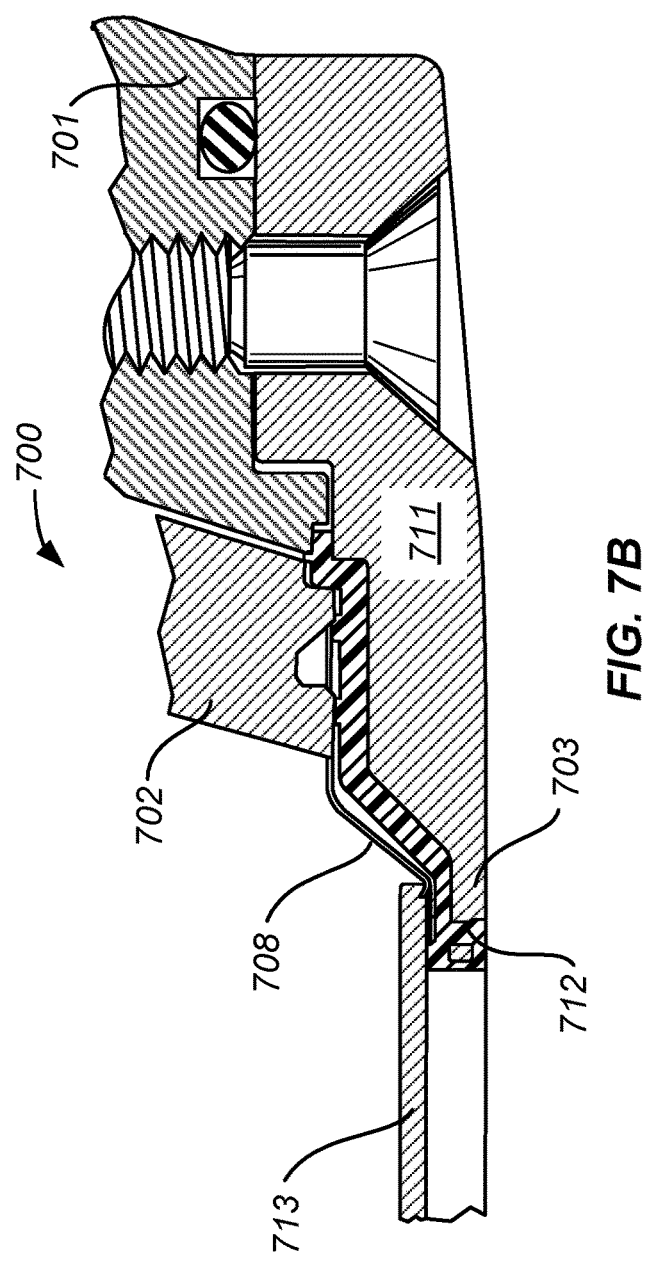
FIG. 7B shows a magnified view of the electroplating cup assembly with the interlocked elastomeric lipseal and cup bottom of FIG. 7A.

FIG. 7A shows a cross-sectional side view of an electroplating cup assembly with an interlocked elastomeric lipseal and cup bottom. FIG. 7B shows a magnified view of the electroplating cup assembly with the interlocked elastomeric lipseal and cup bottom of FIG. 7A. An electroplating cup assembly 700 can include a ring-shaped cup bottom 701, where the ring-shaped cup bottom 701 includes a main body portion 711 and a moment arm 703. The moment arm 703 can be a relatively thin extension (radially-inward) of the main body of the ring-shaped cup bottom 701, which serves to support the elastomeric lipseal 712. A bus ring 702 disposed over the main body portion 711 of the ring-shaped cup bottom 701. A wafer 703 may be supported in the electroplating cup assembly 700 by one or more features of the ring-shaped cup bottom 701. One or more electrical contact elements 708 can be disposed on or over the elastomeric lipseal 712, where the one or more electrical contact elements 708 can contact the wafer 713. The moment arm 703 may flex to a certain degree in response to pressure exerted by a cone when the wafer 713 is pressed against by the cone into its sealing and electrical contact arrangement. In contrast, the main body portion 711 is designed to be relatively thick such that it does not substantially flex when the wafer is pressed against the moment arm 703.

The elastomeric lipseal 712 can be mechanically interlocked with the moment arm 703. The moment arm 703 can include one or more through-holes. In FIG. 7B, the elastomeric lipseal 712 can pass through one or more through-holes to form a pillar of elastomeric lipseal material in the one or more through-holes. In some implementations, portions of the elastomeric lipseal 712 pass through the through-holes and extend around an inner lip or an inner edge of the cup bottom 701. In some implementations, a portion of the elastomeric lipseal 712 over the inner lip or the inner edge of the cup bottom 701 may protrude to contact the wafer 713. In some implementations, the elastomeric lipseal 712 may be molded to the moment arm 703 of the cup bottom 701 and around the inner edge of the cup bottom 701. This can inhibit the uncoupling of the elastomeric lipseal 712 from the cup bottom 701.

Figure 8A:
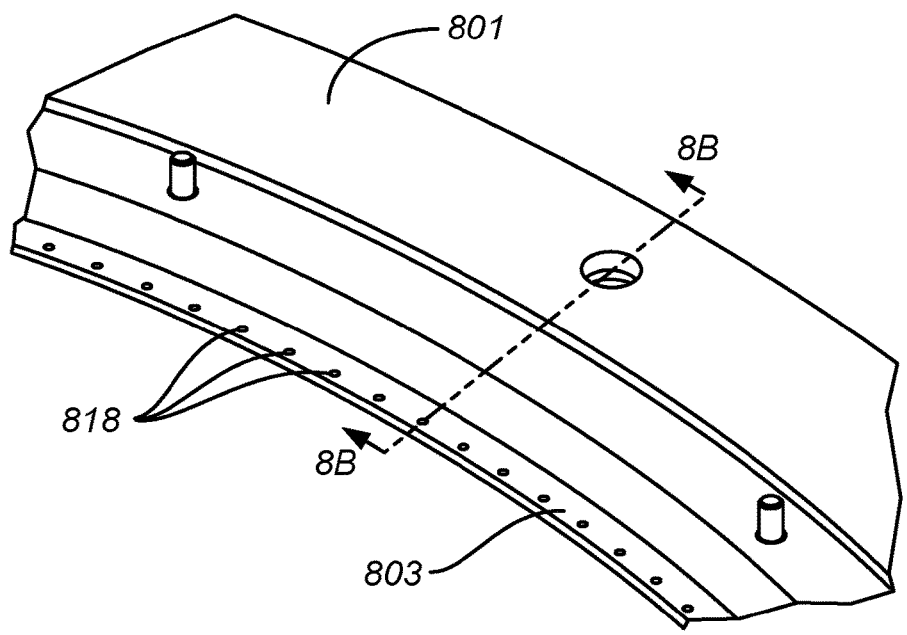
FIG. 8A shows a top perspective view of a portion of an electroplating cup assembly including a radially inwardly protruding surface of a cup bottom with a plurality of through-holes prior to affixing an elastomeric lipseal.

FIG. 8A shows a top perspective view of a portion of an electroplating cup assembly including a radially inwardly protruding surface of a cup bottom with a plurality of through-holes prior to affixing an elastomeric lipseal. An electroplating cup assembly 800 includes a cup bottom 801 with a radially inwardly protruding surface 803. The radially inwardly protruding surface 803 includes a plurality of through-holes 818. The plurality of through-holes 818 can provide a structural feature by which elastomeric lipseal material can form into and around to mechanically interlock the elastomeric lipseal material to the cup bottom 801.

The total number of through-holes 818 in the radially inwardly protruding surface 803 of the cup bottom 801 may be between about 100 and about 500, or between about 150 and about 300, or between about 180 and about 250. The diameter of the through-holes 818 in the radially inwardly protruding surface 803 of the cup bottom may be between about 0.01 inches and about 0.05 inches, or between about 0.02 inches and about 0.04 inches. The distance between the inner edge of the cup bottom 801 and the center of the through-holes 818 may be between about 0.005 and about 0.05 inches, or between about 0.01 and about 0.03 inches. In the angular/azimuthal direction, the plurality of through-holes 818 may be uniformly spaced apart. The separation distance between centers of adjacent through-holes 818 in the angular/azimuthal direction in the radially inwardly protruding surface 803 may be between about 0.05 and about 0.25 inches, or between about 0.08 and about 0.18 inches. As an example, the radially inwardly protruding surface 803 can have 240 through-holes 818, each of which are 0.026 inches in diameter, with an azimuthal separation of 0.15 inches between hole-centers. In some implementations, the through-holes 818 are located directly under a sealing feature of the elastomeric lipseal in the cup bottom 801.

Figure 8B:
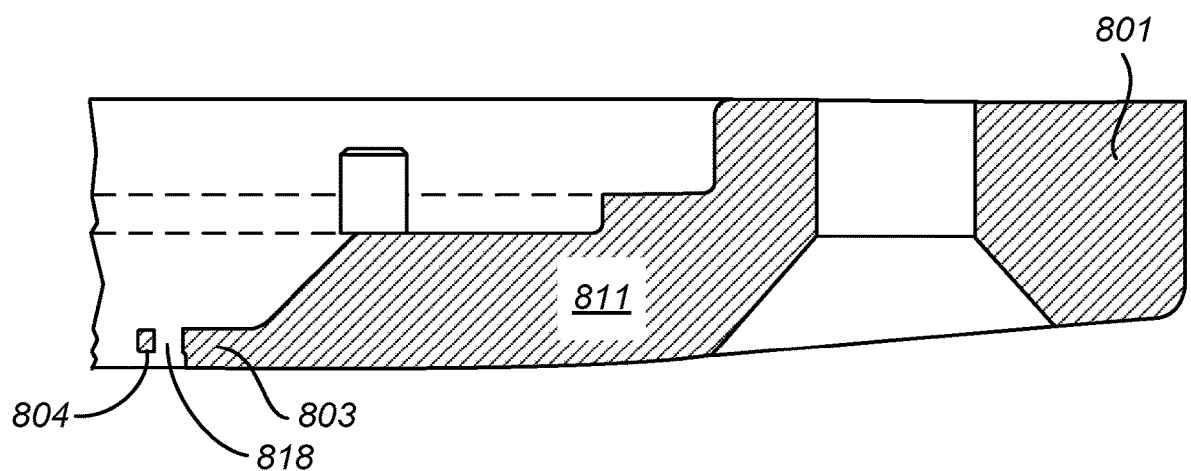
FIG. 8B shows a cross-sectional view of the electroplating cup assembly including the radially inwardly protruding surface of the cup bottom with the plurality of through-holes along line 8B-8B of FIG. 8A.

FIG. 8B shows a cross-sectional view of the electroplating cup assembly including the radially inwardly protruding surface of the cup bottom with the plurality of through-holes along line 8B-8B of FIG. 8A. The cup bottom 801 includes a main body portion 811 and a radially inwardly protruding surface 803 with a through-hole 818 extending through the radially inwardly protruding surface 803. The through-hole 818 is defined between an inner edge 804 of the cup bottom 801 and a remainder of the radially inwardly protruding surface 803 of the cup bottom 801. The thickness of the cup bottom 701 at the location of the through-hole 818 may be between about 0.01 and about 0.05 inches, or between about 0.02 and about 0.04 inches.

The material from which the cup bottom 801 is formed is typically a relatively rigid material, which may be conductive or insulating. In some implementations, the cup bottom 801 is made from a metal such as titanium, or a titanium alloy, or stainless steel. In implementations where the cup bottom 801 is made from a conductive material, the conductive material may be coated with an insulating material. In some implementations, the cup bottom 801 is made from a non-conductive material such as a plastic, including but not limited to PPS or polyether ether ketone (PEEK). In some implementations, the non-conductive material is a polymeric material that is unfilled. In some implementations, the cup bottom 801 is made from a ceramic material. In certain implementations, the cup bottom 801 has a rigidity characterized by a Young's modulus of between about 300,000 and 55,000,000 psi, or more particularly between about 450,000 and 30,000,000 psi.

Prior to affixing an elastomeric lipseal to the cup bottom 801, adhesion to the radially inwardly protruding surface 803 can be facilitated by treating the radially inwardly protruding surface 803. In some implementations, at least the radially inwardly protruding surface 803 of the cup bottom 801 is exposed to an agent that improves adhesion between the elastomeric lipseal and radially inwardly protruding surface. This treatment may chemically or physically change the surface of the cup bottom 801 exposed to the agent by, for example, increasing roughness, applying or removing electrical charge, oxidizing or reducing chemical moieties, and/or passivating reactive moieties. The treatment prepares the surface of the cup bottom 801 to accept an adhesive or otherwise improve the bond between the elastomeric lipseal and the cup bottom 801. In some implementations, the treatment improves adhesion by oxidizing the surface of the cup bottom 801. Where the cup bottom 801 is made from PPS or a similar polymeric material, the treatment may oxidize the surface of the polymeric material prior to applying an adhesion promoter. A treatment agent can include a plasma or strong oxidizing acid, such as nitric acid, sulfuric acid, perchloric acid, persulfuric acid, etc. In some implementations, the treatment includes contacting at least the radially inwardly protruding surface 803 with concentrated nitric acid (such as between about 20-70% by weight) for about 1 to 5 minutes (such as about 2 minutes). The contact may involve soaking. In some implementations, thereafter, the method may apply an adhesive or solvent-based adhesion promoter prior to affixing the elastomeric lipseal.

Prior to affixing the elastomeric lipseal to the cup bottom 801, adhesion to the radially inwardly protruding surface 803 can be facilitated by application of an adhesive or adhesion promoter between the elastomeric lipseal and the radially inwardly protruding surface 803. This can be done in addition to or in the alternative with the treatment agent for treating at least the radially inwardly protruding surface 803. Various types of adhesives or adhesion promoters may be used to improve adherence of the elastomeric lipseal to the radially inwardly protruding surface 803. In some implementations, the method uses a solvent-based adhesion promoter that enhances surface cleaning and aids in penetration of the elastomeric lipseal into the wafer bonding surface. One example of a suitable adhesive is 1200 OS from Dow Corning Corporation of Midland, Mich. In some implementations, the adhesive or adhesion promoter is applied after treatment with a treatment agent as described above.

Figure 9A:
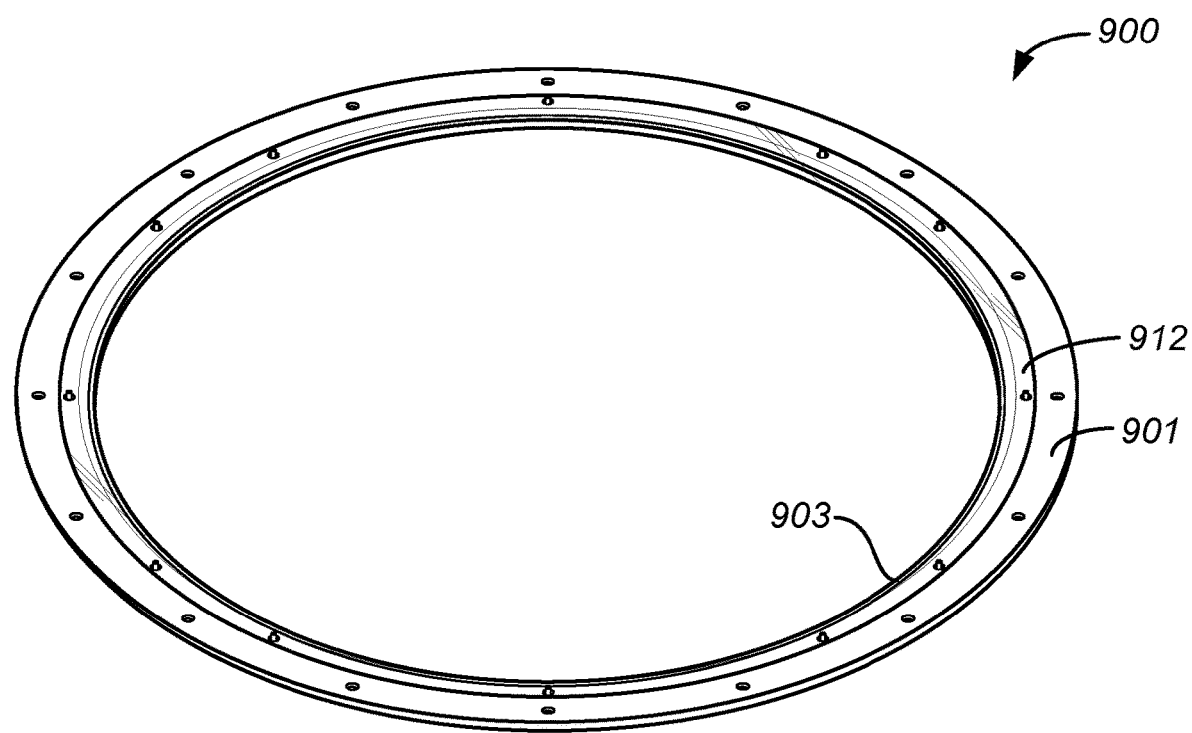
FIG. 9A shows a perspective view of an electroplating cup assembly with an elastomeric lipseal.

FIG. 9A shows a perspective view of an electroplating cup assembly with an elastomeric lipseal. In the illustrated electroplating cup assembly 900, an elastomeric lipseal 912 maybe molded in (or into or onto, etc.) a cup bottom 901 or otherwise affixed to the cup bottom 901. The cup bottom 901 can include a radially inwardly protruding surface 903 upon which the elastomeric lipseal 912 is disposed. As shown in FIG. 9A, the electroplating cup assembly 900 is an annular structure, and the cup bottom 901 and the elastomeric lipseal 912 are generally ring-shaped.

Figure 9B:
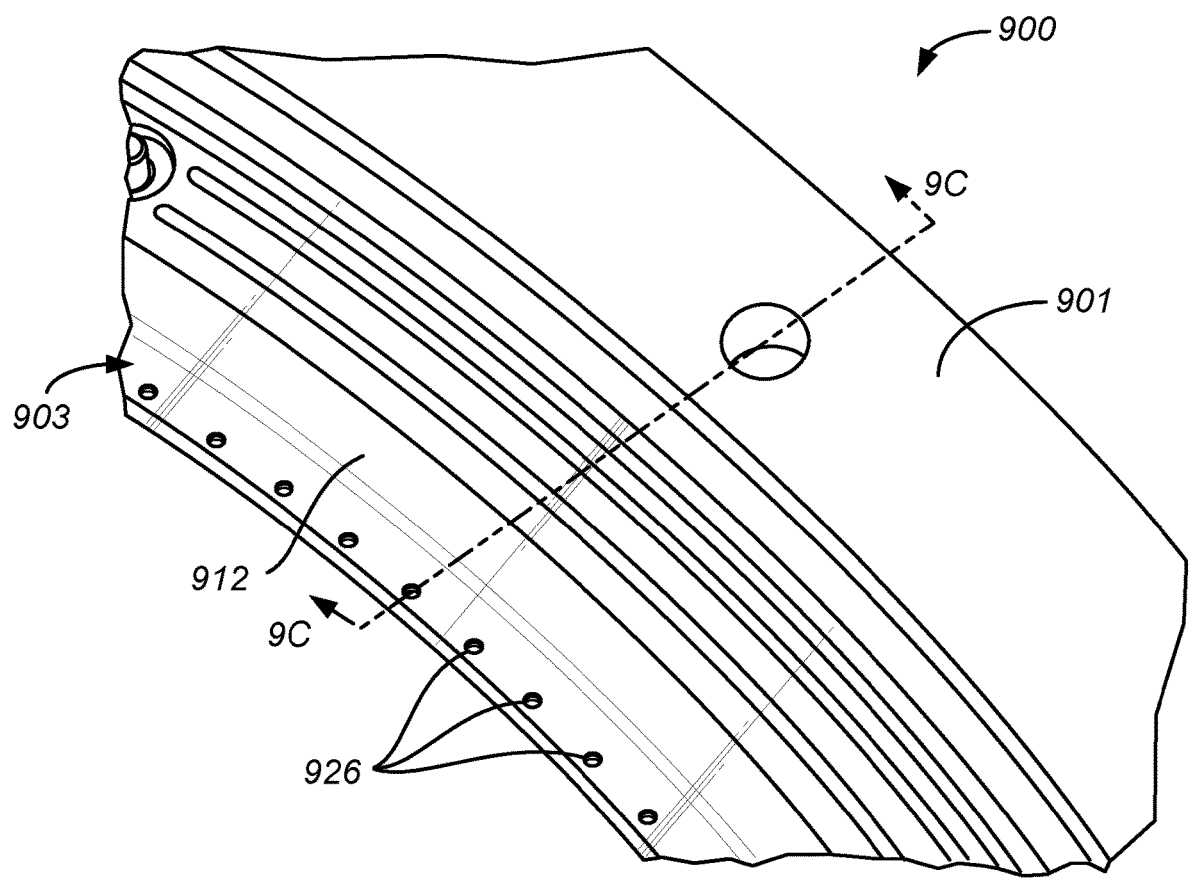
FIG. 9B shows a top perspective view of a portion of the electroplating cup assembly of FIG. 9A and including the elastomeric lipseal on a radially inwardly protruding surface of a cup bottom.
Figure 9C:
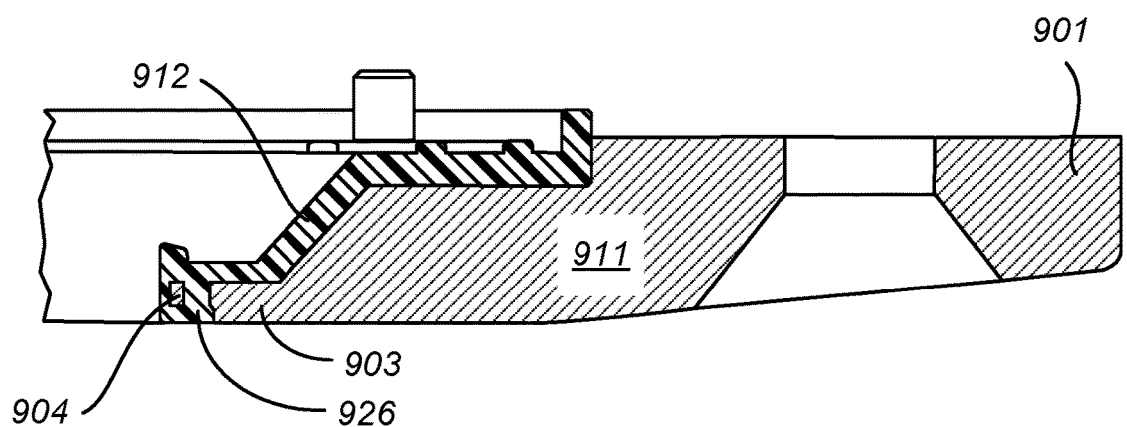
FIG. 9C shows a cross-sectional schematic view of the electroplating cup assembly including the elastomeric lipseal on the radially inwardly protruding surface of the cup bottom along line 9C-9C of FIG. 9B.

FIG. 9B shows a top perspective view of a portion of the electroplating cup assembly of FIG. 9A and including the elastomeric lipseal on a radially inwardly protruding surface of a cup bottom. FIG. 9C shows a cross-sectional schematic view of the electroplating cup assembly including the elastomeric lipseal on the radially inwardly protruding surface of the cup bottom along line 9C-9C of FIG. 9B. FIG. 9B shows a radial slice of the annular structure of the electroplating cup assembly 900 of FIG. 9A. The cup bottom 901 includes a main body portion 911 and a radially inwardly protruding surface 903. The elastomeric lipseal 912 is disposed over a portion of the cup bottom 901 that includes the radially inwardly protruding surface 903, where the radially inwardly protruding surface 903 includes a plurality of through-holes. Portions 926 of the elastomeric lipseal 912 pass through the through-holes. The portions 926 of the elastomeric lipseal 912 may also pass around an inner lip 904 of the radially inwardly protruding surface 903. In some implementations, the portions 926 of the elastomeric lipseal 912 can encircle the inner lip 904 of the radially inwardly protruding surface 903 so that the elastomeric lipseal 912 can be mechanically interlocked with the cup bottom 901. In some implementations, the elastomeric lipseal 912 directly adheres to the radially inwardly protruding surface 903, and the portions 926 of the elastomeric lipseal 912 passing through the plurality of through-holes fill the plurality of through holes. In some implementations, the portions 926 of the elastomeric lipseal 912 can constitute pillars of elastomeric material. The pillars of elastomeric material 926 can be formed in, into, onto, along, and around structural features of the radially inwardly protruding surface 903 of the cup bottom 901, including through-holes of the radially inwardly protruding surface 903 of the cup bottom 901.

The cup bottom 901, including the radially inwardly protruding surface 903, can be made of a relatively rigid material, such as PPS or PEEK. In some implementations, the cup bottom 901 can be made of a metal, such as titanium, or a titanium alloy, or stainless steel. The elastomeric lipseal 912, including the pillars of elastomeric material 926, can be made of a material that is less rigid than the cup bottom 901. In some implementations, the elastomeric lipseal 912 can include an elastomer that is a room temperature vulcanized (RTV) silicone. In some implementations, the elastomeric lipseal 912 can include an elastomer that is a perfluoroelastomer.

Figure 9D:
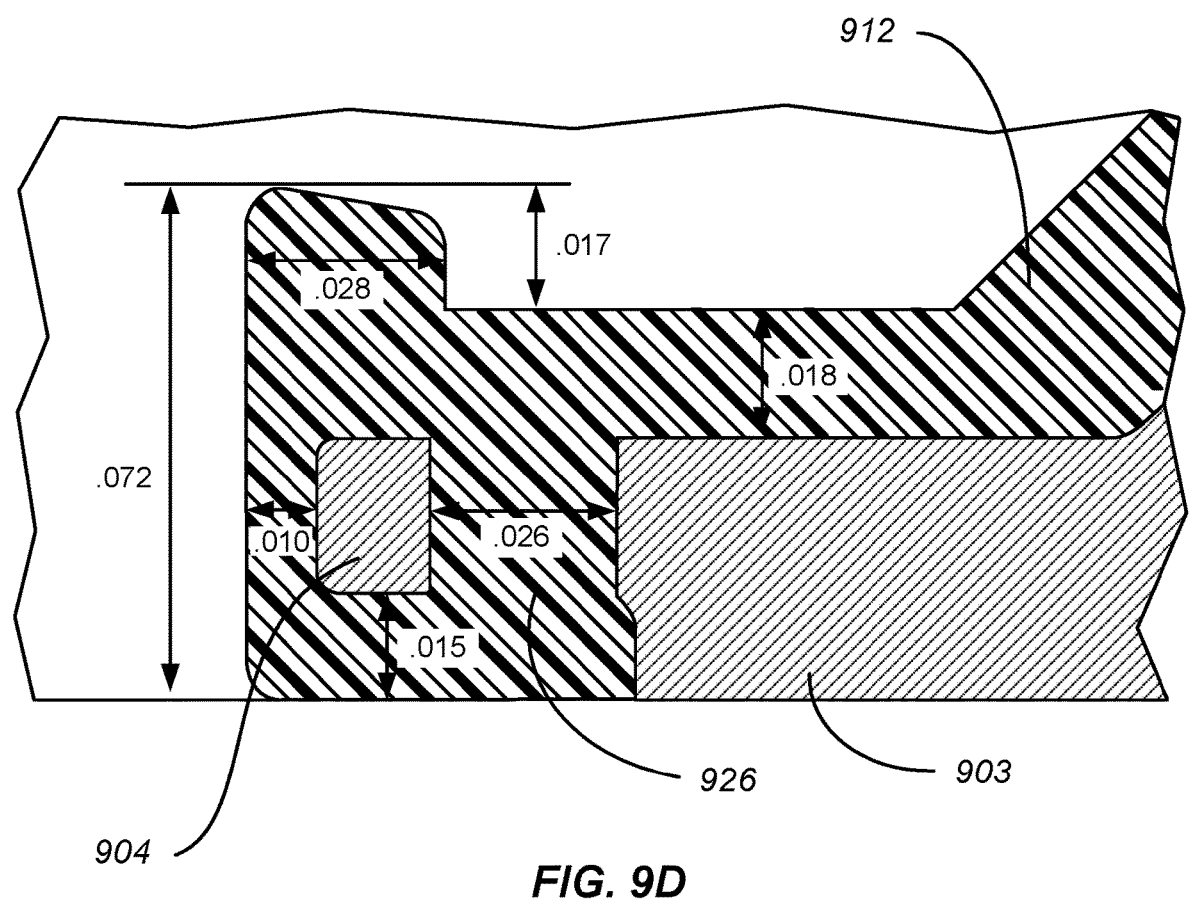
FIG. 9D shows a magnified view of FIG. 9C of the elastomeric lipseal passing through a through-hole of the radially inwardly protruding surface of the cup bottom.

FIG. 9D shows a magnified view of FIG. 9C of the elastomeric lipseal passing through a through-hole of the radially inwardly protruding surface of the cup bottom. As illustrated in FIGS. 9A-9D, the elastomeric lipseal 912 can be integrated with the cup bottom 901 by molding or otherwise affixing the elastomeric lipseal 912 directly to (onto, over, into, etc.) the cup bottom 901, including the radially inwardly protruding surface 903 and its plurality of through-holes. In some implementations, the cup bottom 901, or at least the radially inwardly protruding surface 903, may be treated chemically to enhance adhesion. In some implementations, an adhesive or adhesion promoter may be disposed between the elastomeric lipseal 912 and at least the radially inwardly protruding surface 903 of the cup bottom 901.

FIG. 9D shows dimensions of an example elastomeric lipseal 912. In FIG. 9D, the elastomeric lipseal 912 includes a portion 926 that passes through a through-hole and encircles an inner lip 904 of a radially inwardly protruding surface 903. The elastomeric lipseal 912 disposed on the radially inwardly protruding surface 903 can have a thickness of about 0.018 inches. The portion 926 of the elastomeric lipseal 912 that passes through the through-hole can have a diameter of about 0.026 inches. The portion 926 of the elastomeric lipseal 912 that encircles the inner lip 904 underneath the inner lip 904 can have a thickness of about 0.015 inches. The portion 926 of the elastomeric lipseal 912 that encircles the inner lip 904 facing outwards from the inner lip 904 can have a width of about 0.01 inches. The portion 926 of the elastomeric lipseal 912 that encircles the inner lip 904 directly above the inner lip 904 can have a height of about 0.035 inches and a width of about 0.028 inches. Thus, the portion 926 of the elastomeric lipseal 912 can protrude at a height more than the thickness of the elastomeric lipseal 912 disposed on the radially inwardly protruding surface 903. A peripheral region of a wafer can contact the elastomeric lipseal 912 at such a protrusion to seal the wafer from plating solution. The protrusion can provide a point of contact that the wafer is supported on and pressed against, where the protrusion can provide the sealing force against the wafer to prevent the plating solution from entering. The height of such a protrusion can be about 0.017 inches. The total height of the portion 926 of the elastomeric lipseal 912 from top to bottom can be about 0.072 inches.

Figure 9E:
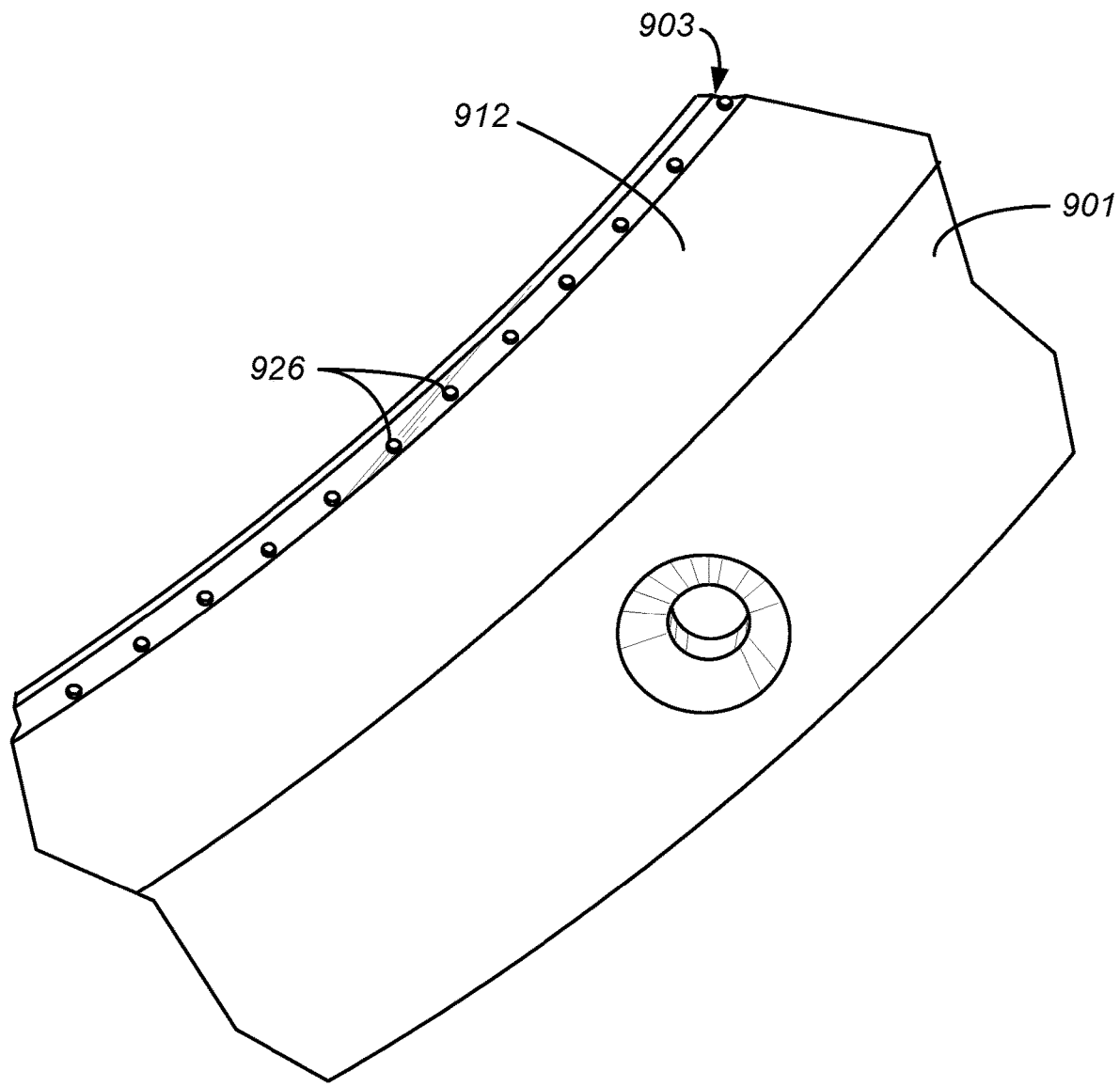
FIG. 9E shows a bottom perspective view of a portion the electroplating cup assembly of FIG. 9A and including the elastomeric lipseal on the radially inwardly protruding surface of the cup bottom.

FIG. 9E shows a bottom perspective view of a portion the electroplating cup assembly of FIG. 9A and including the elastomeric lipseal on the radially inwardly protruding surface of the cup bottom. The elastomeric lipseal 912 can be affixed to both a top portion of the radially inwardly protruding surface 903 and a bottom portion of the radially inwardly protruding surface 903.

Whereas oftentimes the elastomeric lipseal or sealing element used to seal a wafer in an electroplating clamshell is a separate component that is installed into the electroplating clamshell prior to an electroplating operation, the present disclosure integrates the elastomeric lipseal and a cup bottom of the electroplating clamshell during the manufacturing process. In some implementations, the elastomeric lipseal can be affixed to the cup bottom during manufacturing by adhesion, molding, or another suitable process that inhibits the uncoupling of the elastomeric lipseal from the cup bottom. As such, the elastomeric lipseal may be viewed as a permanent or integrated feature of the cup bottom rather than as a separate removable component.

Manufacture of an Integrated Elastomeric Lipseal and Cup Bottom

Figure 10:
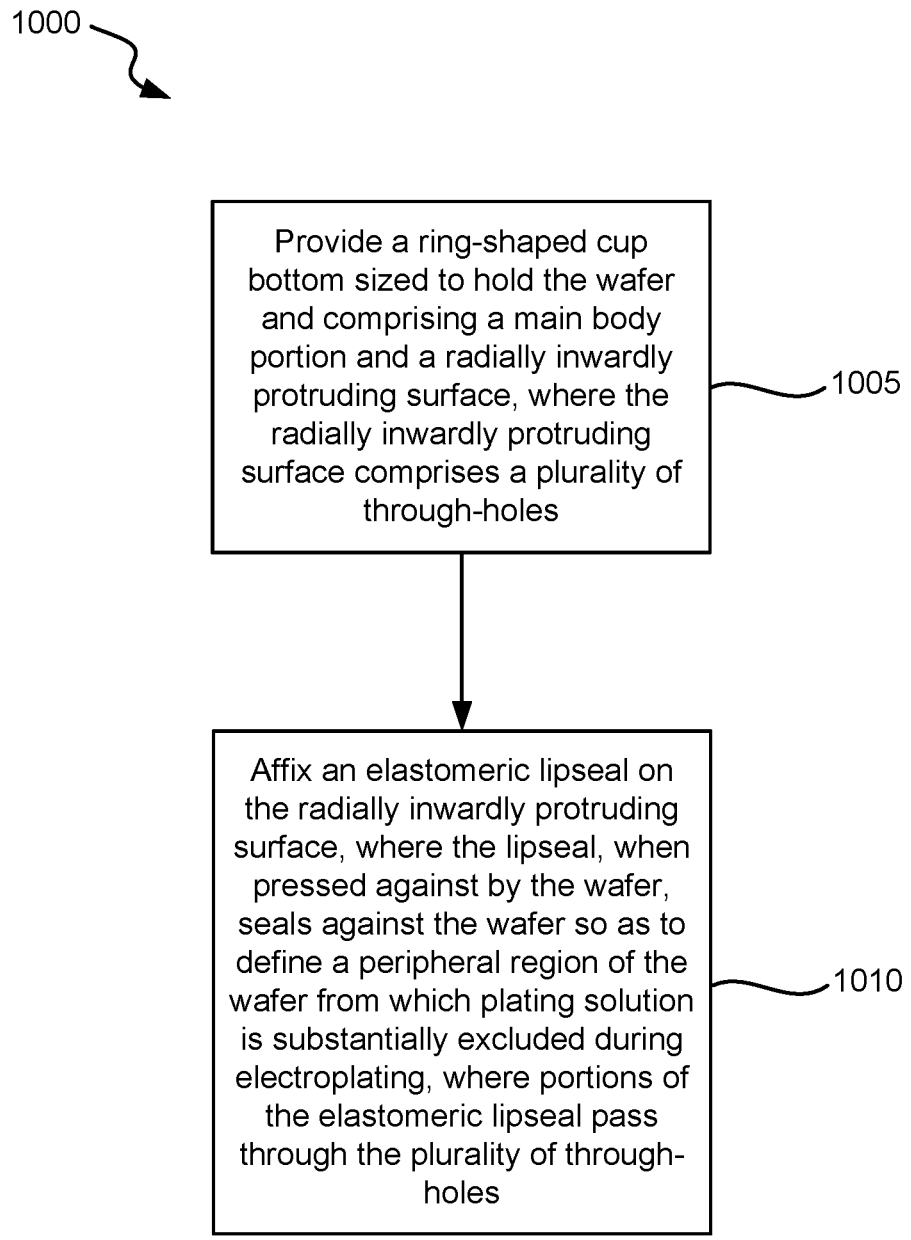
FIG. 10 is a flowchart illustrating a method of forming an elastomeric lipseal on a radially inwardly protruding surface of a cup bottom.

FIG. 10 is a flowchart illustrating a method of forming a lipseal on a radially inwardly protruding surface of a cup bottom. The operations in a process 1000 may be performed in different orders and/or with different, fewer, or additional operations.

A process 1000 can begin at block 1005, where a cup bottom is provided, the cup bottom being sized to hold a wafer and including a main body portion and a radially inwardly protruding surface. The radially inwardly protruding surface includes a plurality of through-holes.

In some implementations, the cup bottom is made of a relatively rigid material. For example, the cup bottom can include a polymeric material, such as PPS or PEEK. In some implementations, the radially inwardly protruding surface includes between about 100 and 500 through-holes. In some implementations, each of the through-holes can have a diameter of between about 0.01 inches and 0.05 inches. In some implementations, a distance between an inner edge or inner lip of the cup bottom and a center of the through-holes is between about 0.05 inches and 0.5 inches. In some implementations, a thickness of the radially inwardly protruding surface of the cup bottom at the location of the through-holes is between about 0.02 inches and 0.05 inches.

In some implementations, the process 1000 can further include treating the radially inwardly protruding surface of the cup bottom, prior to affixing the elastomeric lipseal, with an agent that facilitates adhesion between the elastomeric lipseal and the radially inwardly protruding surface of the cup bottom. The agent may chemically or physically change the surface of the cup bottom by, for example, increasing roughness, applying or removing electrical charge, oxidizing or reducing chemical moieties, and/or passivating reactive moieties. In some implementations, the agent can include a plasma or strong oxidizing acid, such as nitric acid, sulfuric acid, perchloric acid, persulfuric acid, etc.

In the alternative or in addition to the aforementioned treatment, the process 1000 can further include applying an adhesive, prior to affixing the elastomeric lipseal, to the radially inwardly protruding surface of the cup bottom or the elastomeric lipseal to promote adhesion between the radially inwardly protruding surface of the cup bottom and the elastomeric lipseal. Various types of adhesives or adhesion promoters may be used to improve adherence of the elastomeric lipseal to the radially inwardly protruding surface, such as 1200 OS from Dow Corning Corporation of Midland, Mich.

At block 1010 of the process 1000, an elastomeric lipseal is affixed on the radially inwardly protruding surface, where the elastomeric lipseal, when pressed against by the wafer, seals against the wafer to as to define a peripheral region of the wafer from which plating solution is substantially excluded during electroplating. Portions of the elastomeric lipseal pass through the plurality of through-holes. Such portions may constitute pillars of elastomeric material. In some implementations, such portions of the elastomeric lipseal passing through the plurality of through-holes can also extend around an inner edge or inner lip of the cup bottom. In some implementations, the elastomeric lipseal may encircle the inner edge or inner lip of the cup bottom.

In some implementations, affixing the elastomeric seal can include providing a mold in the shape of the elastomeric lipseal around a portion of the radially inwardly protruding surface, including the plurality of through-holes, delivering a lipseal precursor to the mold, and converting the lipseal precursor to the elastomeric lipseal. Accordingly, the elastomeric lipseal is formed in situ inside the cup bottom, for instance, by molding it directly into the cup bottom. In this approach, a chemical precursor (such as the lipseal precursor) to the elastomeric lipseal is placed in the location of the cup bottom surface where the elastomeric lipseal is to reside. The chemical precursor is processed so as to form the desired elastomeric lipseal, such as by polymerization, curing, or other mechanism that converts the chemical precursor into the formed elastomeric lipseal having the desired final structural shape. Examples of curing agents can include cross-linking agents, elevated temperatures, and ultraviolet radiation.

In some implementations, affixing the elastomeric lipseal can include pre-forming the elastomeric lipseal into its desired final shape and then integrating it with the rigid cup bottom. The pre-formed elastomeric lipseal is integrated with the radially inwardly protruding surface of the cup bottom during the manufacture of the cup assembly. This can be done by affixing the pre-formed elastomeric lipseal to the appropriate location on the cup bottom via adhesive, glue, etc. or some other appropriate affixing mechanism.

In some implementations, the process 1000 can further include applying an electrical contact element on or proximate to the elastomeric lipseal, where the electrical contact element contacts the wafer in the peripheral region when the elastomeric seals against the wafer so that the electrical contact element may provide electrical power to the wafer during electroplating. In some implementations, numerous parallel electrical contact elements may be provided around the wafer and applied to contact the wafer.

Through integrated manufacture of the cup assembly with its elastomeric lipseal, the elastomeric lipseal can be formed more precisely into its desired shape, and positioned more precisely within the structure of the cup bottom of the cup assembly than what is generally achieved with the manufacture of the cup assembly and sealing elements as separate components. This allows, in conjunction with the rigid support of the cup bottom, the precise locating of the portion of the elastomeric lipseal which contacts the wafer. Accordingly, because less margin for positioning error is required, sealing elements having reduced radial profiles may be employed, which in turn, allows the sealing elements to be designed for contacting the wafer within the cup assembly significantly closer to the wafer's edge, reducing the edge exclusion region during electroplating operations.

System Controllers

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery and circulation of electrolyte, temperature settings (e.g., heating and/or cooling), pressure settings, vacuum settings, electrical power settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller may communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Lithographic Patterning

The apparatuses/processes described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Other Embodiments

Although illustrative embodiments and applications of this invention are shown and described herein, many variations and modifications are possible which remain within the concept, scope, and spirit of the invention, and these variations would become clear to those of ordinary skill in the art after perusal of this application. Accordingly, the present embodiments are to be considered as illustrative and not restrictive, and the invention is not to be limited to the details given herein, but may be modified within the scope and equivalents of the appended claims.

What is claimed is:

1. A lipseal comprising:
   a plurality of pillars of elastomeric material passing through a plurality of through-holes of a radially inwardly protruding moment arm of a cup bottom; and an interlocking portion of the elastomeric material surrounding an inner edge of the radially inwardly protruding moment arm, wherein the interlocking portion connects with the plurality of pillars of the elastomeric material to encircle the inner edge of the radially inwardly protruding moment arm.

2. The lipseal of claim 1, wherein the elastomeric material is disposed along a surface of the radially inwardly protruding moment arm of the cup bottom.

3. The lipseal of claim 1, wherein the interlocking portion and the plurality of pillars are connected to encircle the inner edge of the radially inwardly protruding moment arm to provide mechanical interlocking of the elastomeric material with the cup bottom.

4. The lipseal of claim 1, wherein each of the plurality of pillars has a diameter between about 0.01 inches and about 0.05 inches.

5. The lipseal of claim 1, further comprising:
a protruding portion of the elastomeric material that protrudes vertically from the inner edge of the radially inwardly protruding moment arm.

6. The lipseal of claim 1, wherein a distance between an inner edge of the radially inwardly protruding moment arm and a center of the through-hole is between about 0.05 inches and 0.5 inches.

7. A ring-shaped cup bottom of an electroplating cup assembly, the ring-shaped cup bottom comprising:
a main body portion; and
a radially inwardly protruding moment arm connected to the main body portion, wherein the radially inwardly protruding moment arm comprises a plurality of through-holes.

8. The ring-shaped cup bottom of claim 7, wherein the plurality of through-holes are configured to receive portions of an elastomeric lipseal passing therethrough.

9. The ring-shaped cup bottom of claim 8, wherein the radially inwardly protruding moment arm comprises an inner edge, wherein the inner edge is configured to receive the portions of the elastomeric lipseal passing through the plurality of through-holes so that the portions of the elastomeric lipseal surround the inner edge.

10. The ring-shaped cup bottom of claim 9, wherein the elastomeric lipseal is mechanically interlocked with the inner edge of the radially inwardly protruding moment arm.

11. The ring-shaped cup bottom of claim 9, wherein a distance between the inner edge and a center of the through-holes is between about 0.05 inches and about 0.5 inches.

12. The ring-shaped cup bottom of claim 7, wherein the cup bottom comprises a polymeric material.

13. The ring-shaped cup bottom of claim 12, wherein the polymeric material is PPS.

14. The ring-shaped cup bottom of claim 7, wherein each of the through-holes has a diameter between about 0.01 inches and about 0.05 inches.

15. The ring-shaped cup bottom of claim 7, wherein the radially inwardly protruding moment arm of the cup bottom comprises between about 100 through-holes and about 500 through-holes.

16. The ring-shaped cup bottom of claim 7, wherein the radially inwardly protruding moment arm is configured to support an elastomeric lipseal.

* * * * *